US012777833B2

(12) United States Patent
Yanagisawa et al.

(10) Patent No.: US 12,777,833 B2
(45) Date of Patent: Oct. 27, 2026

(54) MOTHER SUBSTRATE FOR DISPLAY DEVICE

(71) Applicant: Magnolia White Corporation, Tokyo (JP)

(72) Inventors: Sho Yanagisawa, Tokyo (JP); Hiroshi Tabatake, Tokyo (JP); Kota Makishi, Tokyo (JP); Kazuyuki Endou, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 430 days.

(21) Appl. No.: 18/436,096

(22) Filed: Feb. 8, 2024

(65) Prior Publication Data

US 2024/0276860 A1 Aug. 15, 2024

(30) Foreign Application Priority Data

Feb. 10, 2023 (JP) ................................ 2023-019065

(51) Int. Cl.
*H10K 71/70* (2023.01)
*H10K 59/131* (2023.01)
*H10K 59/80* (2023.01)

(52) U.S. Cl.
CPC ........... *H10K 71/70* (2023.02); *H10K 59/131* (2023.02); *H10K 59/871* (2023.02)

(58) Field of Classification Search
CPC ..... H10K 71/70; H10K 59/131; H10K 59/871
See application file for complete search history.

(56) References Cited

U.S. PATENT DOCUMENTS

2004/0160170 A1 8/2004 Sato et al.
2009/0009069 A1 1/2009 Takata
2013/0170151 A1* 7/2013 Lee .................... G02F 1/13454 361/748
2015/0214245 A1* 7/2015 Kim ...................... G09G 3/006 438/618
2017/0005154 A1 1/2017 You et al.
2019/0363275 A1 11/2019 Ochi et al.
(Continued)

FOREIGN PATENT DOCUMENTS

JP 2000-195677 A 7/2000
JP 2004-207217 A 7/2004
(Continued)

OTHER PUBLICATIONS

Office Action issued in IN Application No. 202414007986, 7pp.

*Primary Examiner* — Zandra V Smith
*Assistant Examiner* — Vicente Rolando Gonzales
(74) *Attorney, Agent, or Firm* — XSENSUS LLP

(57) ABSTRACT

According to one embodiment, a mother substrate for a display device includes an inspection portion. The inspection portion includes first, second, third and fourth pads, a first line portion connected to the first pad, a second line portion connected to the second pad, a third line portion connected to the third pad and the fourth pad and including a middle portion, a first partition connected to the middle portion, a second partition surrounding the first partition, an organic layer provided between the first partition and the second partition, and an upper electrode which covers the organic layer. The upper electrode is in contact with a lower portion of the first partition and a lower portion of the second partition.

20 Claims, 26 Drawing Sheets

(56) References Cited

U.S. PATENT DOCUMENTS

| | | | |
|---|---|---|---|
| 2022/0077251 | A1 | 3/2022 | Choung et al. |
| 2022/0416209 | A1 | 12/2022 | Nishimura et al. |
| 2024/0138217 | A1* | 4/2024 | Tabatake ............... G06F 3/0443 |

FOREIGN PATENT DOCUMENTS

| | | | |
|---|---|---|---|
| JP | 2008-135325 | A | 6/2008 |
| JP | 2009-032673 | A | 2/2009 |
| JP | 2010-118191 | A | 5/2010 |
| WO | 2018/179308 | A1 | 10/2018 |

* cited by examiner

MOTHER SUBSTRATE FOR DISPLAY DEVICE

CROSS-REFERENCE TO RELATED APPLICATIONS

This application is based upon and claims the benefit of priority from Japanese Patent Application No. 2023-019065, filed Feb. 10, 2023, the entire contents of which are incorporated herein by reference.

FIELD

Embodiments described herein relate generally to a mother substrate for a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability has been required.

DETAILED DESCRIPTION

Figure 1:
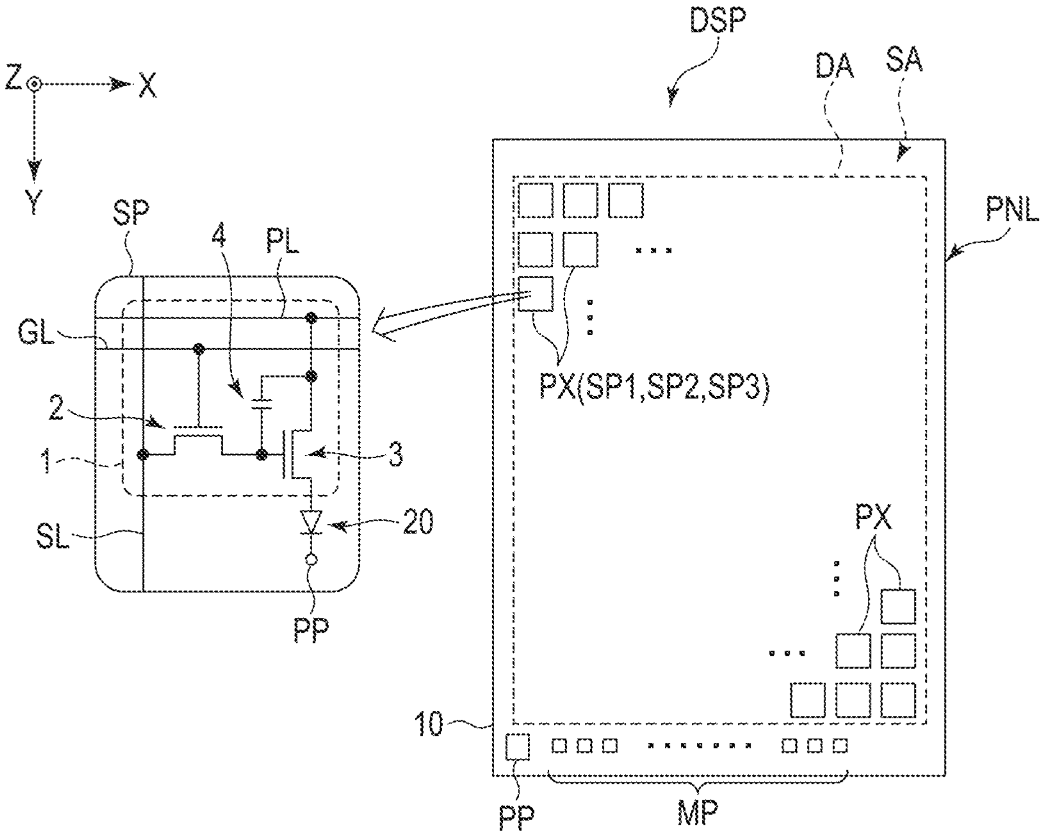
FIG. 1 is a diagram showing a configuration example of a display device DSP.

Embodiments described herein aim to provide a mother substrate for a display device such that the reduction in reliability can be prevented.

In general, according to one embodiment, a mother substrate for a display device comprises a substrate, a plurality of panel portions provided above the substrate, and an inspection portion provided on an external side relative to the panel portions above the substrate. The inspection portion comprises first, second, third and fourth pads arranged in order in a direction, a first line portion electrically connected to the first pad, a second line portion electrically connected to the second pad, a third line portion electrically connected to the third pad and the fourth pad and comprising a middle portion between the first line portion and the second line portion, a first partition electrically connected to the middle portion, a second partition surrounding the first partition and electrically connected to the first line portion and the second line portion, an organic layer provided between the first partition and the second partition, and an upper electrode which covers the organic layer. Each of the first partition and the second partition comprises a lower portion formed of a conductive material and an upper portion provided on the lower portion and protruding from a side surface of the lower portion. The upper electrode is in contact with the lower portion of the first partition and the lower portion of the second partition.

According to another embodiment, a mother substrate for a display device comprises a substrate, a plurality of panel portions provided above the substrate, and an inspection portion provided on an external side relative to the panel portions above the substrate. The inspection portion comprises first, second, third and fourth pads arranged in order in a direction, a first line portion electrically connected to the first pad, a second line portion electrically connected to the second pad, a third line portion electrically connected to the third pad and the fourth pad, a first partition electrically connected to the third line portion, a second partition surrounding the first partition and electrically connected to the first line portion and the second line portion, an organic layer provided between the first partition and the second partition, and an upper electrode which covers the organic layer. Each of the first partition and the second partition comprises a lower portion formed of a conductive material and an upper portion provided on the lower portion and protruding from a side surface of the lower portion. The upper electrode is in contact with the lower portion of the first partition and the lower portion of the second partition.

The embodiments can provide a mother substrate for a display device such that the reduction in reliability can be prevented.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When various elements are viewed parallel to the third direction Z, the appearance is defined as a plan view. When terms indicating the positional relationships of two or more structural elements, such as "on", "above" "between" and "face", are used, the target structural elements may be directly in contact with each other or may be spaced apart from each other as a gap or another structural element is interposed between them. The positive direction of the Z-axis is referred to as "on" or "above".

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display panel PNL comprising a display area DA which displays an image and a surrounding area SA located on an external side relative to the display area DA on an insulating substrate 10. The substrate 10 may be glass or a resinous film having flexibility.

In the embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3. It should be noted that the combination of subpixels is not limited to three elements. The combination may consist of two elements or may consist of four or more elements by adding subpixel SP4, etc., to subpixels SP1 to SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

The surrounding area SA comprises a feed portion PP and a mounting portion MP.

The feed portion PP comprises a feed terminal electrically connected to the cathode of the display element 20.

The mounting portion MP comprises a mounting terminal for connecting signal sources such as an IC chip and a flexible printed circuit board.

Figure 2:
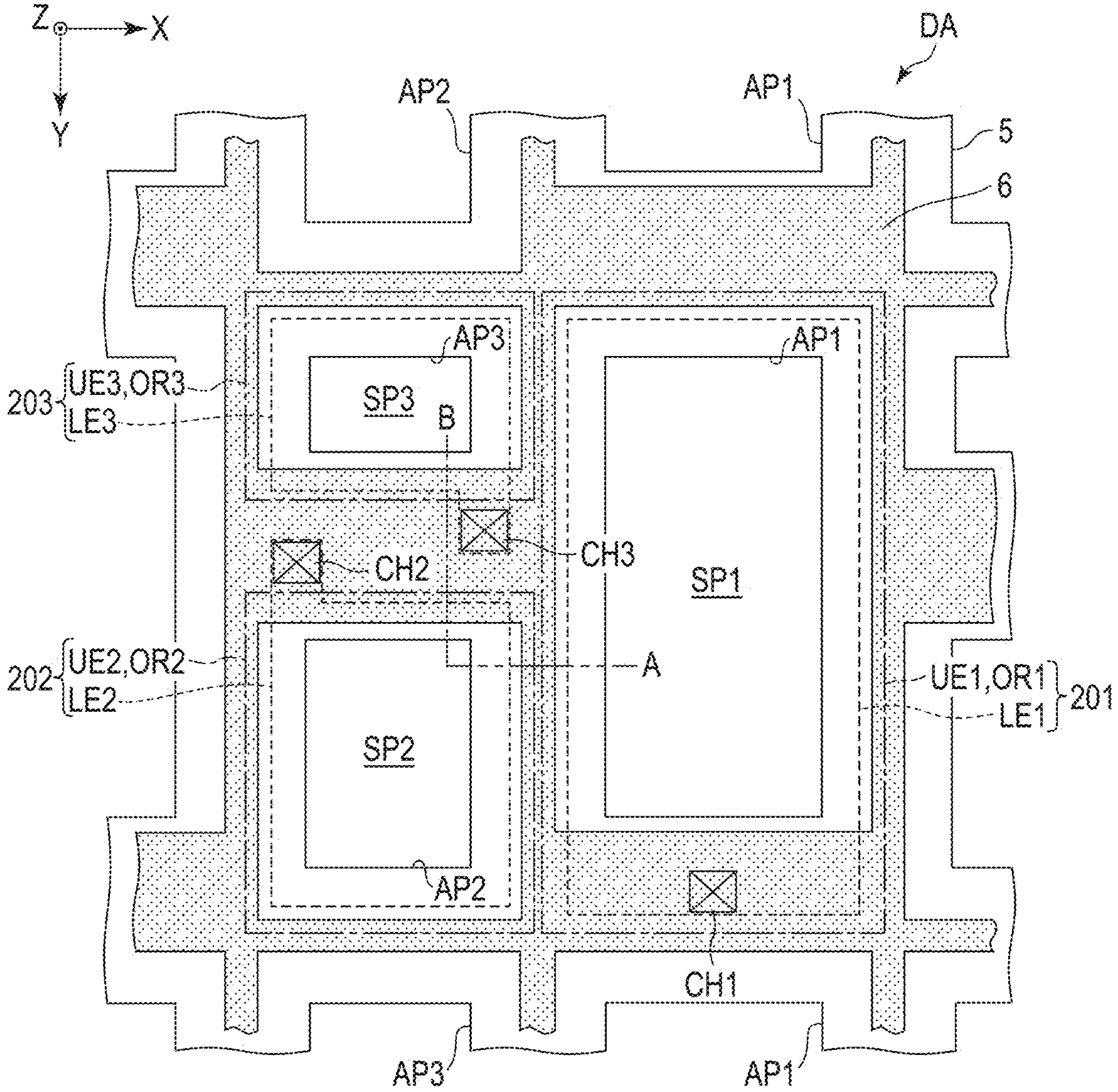
FIG. 2 is a diagram showing an example of the layout of subpixels SP1, SP2 and SP3.

FIG. 2 is a diagram showing an example of the layout of subpixels SP1, SP2 and SP3.

In the example of FIG. 2, subpixels SP2 and SP3 are arranged in the second direction Y. Subpixels SP1 and SP2 are arranged in the first direction X, and subpixels SP1 and SP3 are arranged in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

An inorganic insulating layer 5 and a partition 6 are provided in the display area DA. The inorganic insulating layer 5 comprises apertures AP1, AP2 and AP3 in subpixels SP1, SP2 and SP3, respectively.

The partition 6 overlaps the inorganic insulating layer 5 as seen in plan view. The partition 6 is formed into a grating shape surrounding the apertures AP1, AP2 and AP3. In other words, the partition 6 comprises apertures in subpixels SP1, SP2 and SP3 in a manner similar to that of the inorganic insulating layer 5.

Subpixels SP1, SP2 and SP3 comprise display elements 201, 202 and 203, respectively, as the display elements 20.

The display element 201 of subpixel SP1 comprises a lower electrode LE1, an upper electrode UE1 and an organic layer OR1 overlapping the aperture AP1. The peripheral portion of the lower electrode LE1 is covered with the inorganic insulating layer 5. The organic layer OR1 and the upper electrode UE1 are surrounded by the partition 6. The peripheral portion of each of the organic layer OR1 and the upper electrode UE1 overlaps the inorganic insulating layer 5 as seen in plan view. The organic layer OR1 includes a light emitting layer which emits light in, for example, a blue wavelength range.

The display element 202 of subpixel SP2 comprises a lower electrode LE2, an upper electrode UE2 and an organic layer OR2 overlapping the aperture AP2. The peripheral portion of the lower electrode LE2 is covered with the inorganic insulating layer 5. The organic layer OR2 and the upper electrode UE2 are surrounded by the partition 6. The peripheral portion of each of the organic layer OR2 and the upper electrode UE2 overlaps the inorganic insulating layer 5 as seen in plan view. The organic layer OR2 includes a light emitting layer which emits light in, for example, a green wavelength range.

The display element 203 of subpixel SP3 comprises a lower electrode LE3, an upper electrode UE3 and an organic layer OR3 overlapping the aperture AP3. The peripheral portion of the lower electrode LE3 is covered with the inorganic insulating layer 5. The organic layer OR3 and the upper electrode UE3 are surrounded by the partition 6. The peripheral portion of each of the organic layer OR3 and the upper electrode UE3 overlaps the inorganic insulating layer 5 5 as seen in plan view. The organic layer OR3 includes a light emitting layer which emits light in, for example, a red wavelength range.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. It should be noted that the outer shape of each of the lower electrodes, organic layers and upper electrodes shown in the figure does not necessarily reflect the accurate shape.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1, the area of the aperture AP2 and the area of the aperture AP3 are different from each other. The area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

Figure 3:
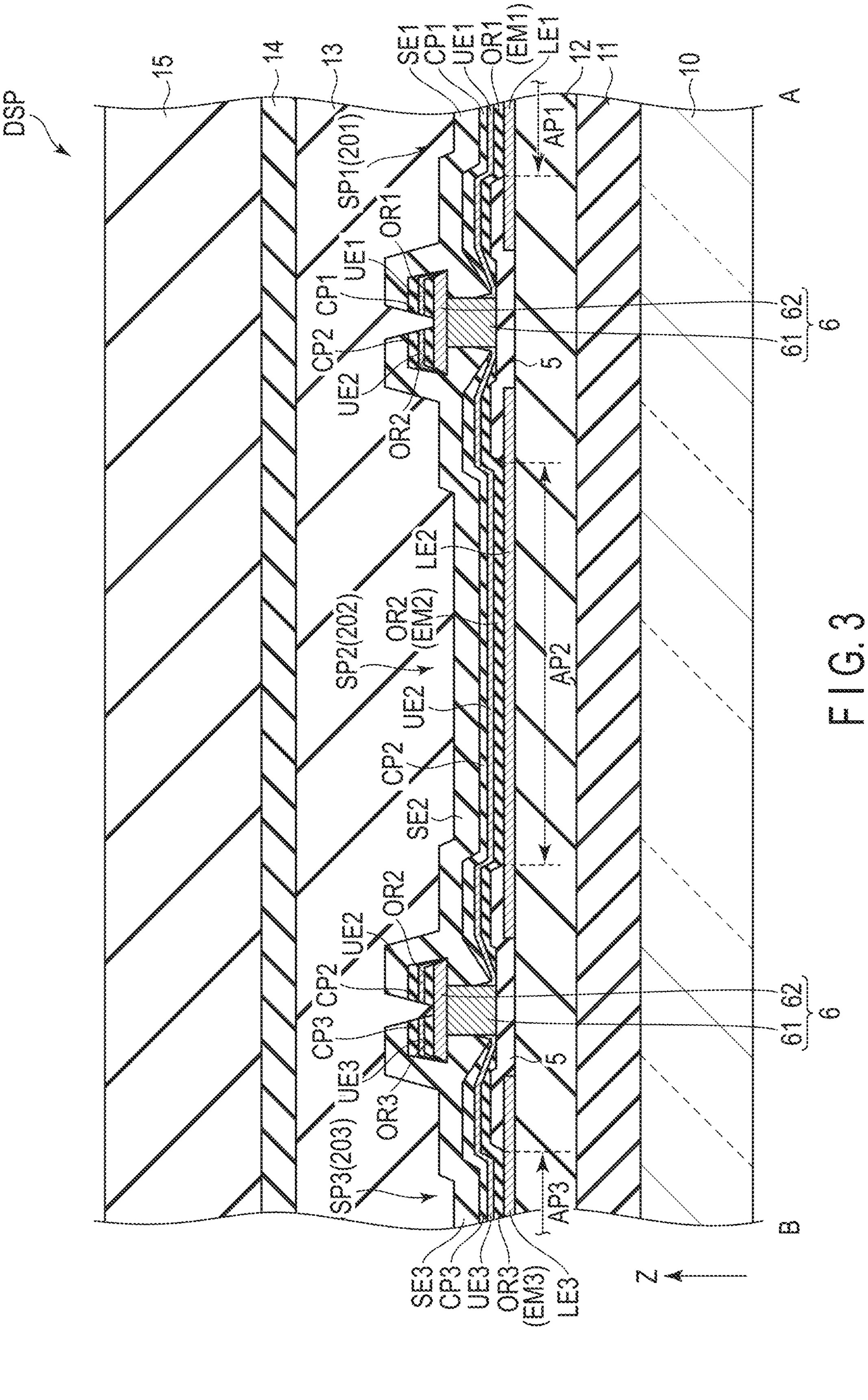
FIG. 3 is a schematic cross-sectional view of the display device DSP along the A-B line of FIG. 2.

FIG. 3 is a schematic cross-sectional view of the display device DSP along the A-B line of FIG. 2.

A circuit layer 11 is provided on the substrate 10. The circuit layer 11 includes various circuits such as the pixel circuit 1 shown in FIG. 1, various lines such as the scanning line GL, the signal line SL and the power line PL and various insulating films. The circuit layer 11 is covered with an organic insulating layer 12. The organic insulating layer 12 planarizes the irregularities formed by the circuit layer 11.

The lower electrodes LE1, LE2 and LE3 are provided on the organic insulating layer 12 and are spaced apart from each other. The inorganic insulating layer 5 is provided on the organic insulating layer 12 and the lower electrodes LE1, LE2 and LE3. The aperture AP1 of the inorganic insulating layer 5 overlaps the lower electrode LE1. The aperture AP2 overlaps the lower electrode LE2. The aperture AP3 overlaps the lower electrode LE3. The peripheral portions of the lower electrodes LE1, LE2 and LE3 are covered with the inorganic insulating layer 5. The organic insulating layer 12 is covered with the inorganic insulating layer 5 between, of the lower electrodes LE1, LE2 and LE3, the lower electrodes which are adjacent to each other. The lower electrodes LE1, LE2 and LE3 are connected to the pixel circuits 1 of subpixels SP1, SP2 and SP3, respectively, through the contact holes provided in the organic insulating layer 12. It should be noted that, although the contact holes of the organic insulating layer 12 are omitted in FIG. 3, the contact holes correspond to the contact holes CH1, CH2 and CH3 of FIG. 2.

The partition 6 includes a conductive lower portion 61 provided on the inorganic insulating layer 5 and an upper portion (cap) 62 provided on the lower portion 61. It should be noted that the lower portion 61 may comprise a bottom layer provided on the inorganic insulating layer 5 and a stem portion provided between the bottom layer and the upper portion 62 as shown in the example described later.

The lower portion 61 of the partition 6 shown on the right side of the figure is located between the aperture AP1 and the aperture AP2. The lower portion 61 of the partition 6 shown on the left side of the figure is located between the aperture AP2 and the aperture AP3. The upper portion 62 has a width greater than that of the lower portion 61. The both end portions of the upper portion 62 protrude relative to the side surfaces of the lower portion 61. This shape of the partition 6 is called an overhang shape.

The organic layer OR1 is in contact with the lower electrode LE1 through the aperture AP1 and covers the lower electrode LE1 exposed from the aperture AP1. The peripheral portion of the organic layer OR1 is located on the inorganic insulating layer 5. The upper electrode UE1 covers the organic layer OR1 and is in contact with the lower portion 61.

The organic layer OR2 is in contact with the lower electrode LE2 through the aperture AP2 and covers the lower electrode LE2 exposed from the aperture AP2. The peripheral portion of the organic layer OR2 is located on the inorganic insulating layer 5. The upper electrode UE2 covers the organic layer OR2 and is in contact with the lower portion 61.

The organic layer OR3 is in contact with the lower electrode LE3 through the aperture AP3 and covers the lower electrode LE3 exposed from the aperture AP3. The peripheral portion of the organic layer OR3 is located on the inorganic insulating layer 5. The upper electrode UE3 covers the organic layer OR3 and is in contact with the lower portion 61.

In the example of FIG. 3, subpixel SP1 comprises a cap layer CP1 and a sealing layer SE1. Subpixel SP2 comprises a cap layer CP2 and a sealing layer SE2. Subpixel SP3 comprises a cap layer CP3 and a sealing layer SE3. The cap layers CP1, CP2 and CP3 function as optical adjustment layers which improve the extraction efficiency of the light emitted from the organic layers OR1, OR2 and OR3, respectively.

The cap layer CP1 is provided on the upper electrode UE1.

The cap layer CP2 is provided on the upper electrode UE2.

The cap layer CP3 is provided on the upper electrode UE3.

The sealing layer SE1 is provided on the cap layer CP1, is in contact with the partition 6 and continuously covers each member of subpixel SP1.

The sealing layer SE2 is provided on the cap layer CP2, is in contact with the partition 6 and continuously covers each member of subpixel SP2.

The sealing layer SE3 is provided on the cap layer CP3, is in contact with the partition 6 and continuously covers each member of subpixel SP3.

In the example of FIG. 3, each of the organic layer OR1, the upper electrode UE1 and the cap layer CP1 is partly located on the partition 6 around subpixel SP1. These portions are spaced apart from, of the organic layer OR1, the upper electrode UE1 and the cap layer CP1, the portions located in the aperture AP1 (the portions constituting the display element 201).

Similarly, each of the organic layer OR2, the upper electrode UE2 and the cap layer CP2 is partly located on the partition 6 around subpixel SP2. These portions are spaced apart from, of the organic layer OR2, the upper electrode UE2 and the cap layer CP2, the portions located in the aperture AP2 (the portions constituting the display element 202).

Similarly, each of the organic layer OR3, the upper electrode UE3 and the cap layer CP3 is partly located on the partition 6 around subpixel SP3. These portions are spaced apart from, of the organic layer OR3, the upper electrode UE3 and the cap layer CP3, the portions located in the aperture AP3 (the portions constituting the display element 203).

The end portions of the sealing layers SE1, SE2 and SE3 are located above the partition 6. In the example of FIG. 3, the end portions of the sealing layers SE1 and SE2 located above the partition 6 between subpixels SP1 and SP2 are spaced apart from each other. The end portions of the sealing layers SE2 and SE3 located above the partition 6 between subpixels SP2 and SP3 are spaced apart from each other.

The sealing layers SE1, SE2 and SE3 are covered with a resin layer 13. The resin layer 13 is covered with a sealing layer 14. The sealing layer 14 is covered with a resin layer 15.

The inorganic insulating layer 5 is formed of, for example, an inorganic insulating material such as silicon nitride (SiNx), silicon oxide (SiOx), silicon oxynitride (SiON) or aluminum oxide ($Al_2O_3$).

Each of the sealing layers SE1, SE2 and SE3 and the sealing layer 14 is formed of, for example, silicon nitride (SiNx). Each of the sealing layers SE1, SE2 and SE3 and the sealing layer 14 may be formed of another inorganic insulating material such as silicon oxide (SiOx), silicon oxynitride (SiON) or aluminum oxide ($Al_2O_3$).

For example, the inorganic insulating layer 5 is formed of a material which is different from the materials of the sealing layers SE1, SE2 and SE3. It should be noted that there is a possibility that the inorganic insulating layer 5 is formed of the same material as the sealing layers SE1, SE2 and SE3.

The lower portion 61 of the partition 6 is formed of a conductive material and is electrically connected to the upper electrodes UE1, UE2 and UE3. The upper portion 62 of the partition 6 is formed of, for example, a conductive material. However, the upper portion 62 may be formed of an insulating material. The lower portion 61 is formed of a material which is different from that of the upper portion 62.

For example, each of the lower electrodes LE1, LE2 and LE3 is a multilayer body including a transparent electrode formed of an oxide conductive material such as indium tin oxide (ITO) and a metal electrode formed of a metal material such as silver.

The organic layer OR1 includes a light emitting layer EM1. The organic layer OR2 includes a light emitting layer EM2. The organic layer OR3 includes a light emitting layer EM3. The light emitting layer EM1, the light emitting layer EM2 and the light emitting layer EM3 are formed of materials which are different from each other. For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the organic layers OR1, OR2 and OR3 includes a plurality of functional layers such as a hole injection layer, a hole transport layer, an electron blocking layer, a hole blocking layer, an electron transport layer and an electron injection layer.

Each of the upper electrodes UE1, UE2 and UE3 is formed of, for example, a metal material such as an alloy of magnesium and silver (MgAg).

Each of the cap layers CP1, CP2 and CP3 is a multilayer body consisting of a plurality of thin films. All of the thin films are transparent and have refractive indices different from each other. It should be noted that at least one of the cap layers CP1, CP2 and CP3 may be omitted.

The circuit layer 11, the organic insulating layer 12 and the inorganic insulating layer 5 are provided over the display area DA and the surrounding area SA. The partition 6 extends from the display area DA to the surrounding area SA.

Figure 4:
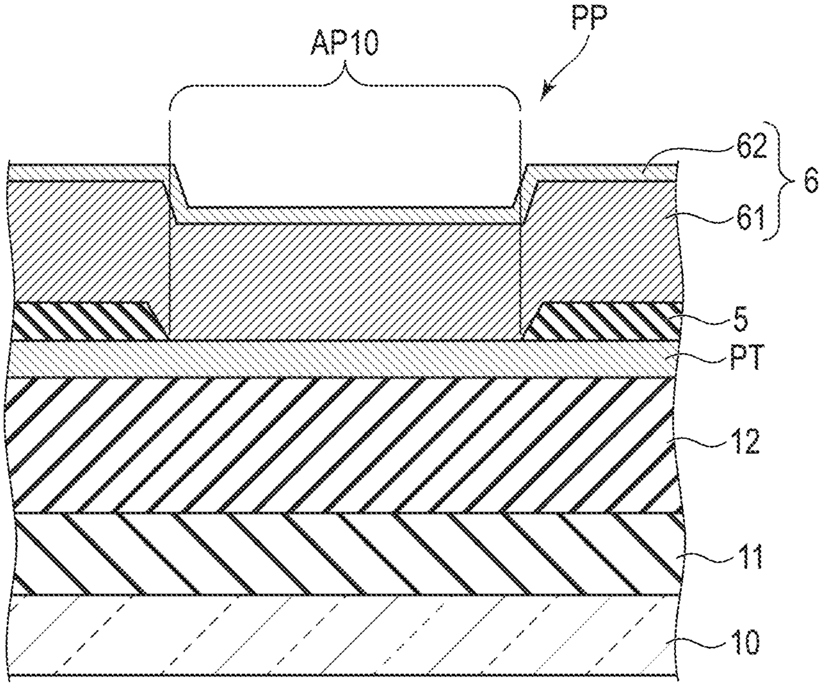
FIG. 4 is a cross-sectional view showing a feed portion PP.

FIG. 4 is a cross-sectional view showing the feed portion PP.

The feed portion PP is provided in the surrounding area SA as shown in FIG. 1.

The feed portion PP comprises a feed terminal PT. The feed terminal PT is provided on the organic insulating layer 12. The feed terminal PT is a terminal for applying common voltage to the cathodes of the display elements. The feed terminal PT is formed of, for example, the same material as the lower electrodes LE1, LE2 and LE3 shown in FIG. 3. The peripheral portions of the feed terminal PT are covered with the inorganic insulating layer 5.

The inorganic insulating layer 5 comprises an aperture AP10 from which the feed terminal PT is exposed.

The partition 6 is provided on the inorganic insulating layer 5 and extends to the feed portion PP. In the feed portion PP, the lower portion 61 of the partition 6 is in contact with the feed terminal PT through the aperture AP10. By this configuration, the upper electrodes UE1, UE2 and UE3 of the display area DA are electrically connected to the feed terminal PT through the partition 6. Common voltage is applied to the upper electrodes UE1, UE2 and UE3 from the feed terminal PT.

Now, this specification explains the manufacturing method of the display device DSP with reference to FIG. 5 to FIG. 13. In FIG. 5 to FIG. 13, the illustration of the lower side of the organic insulating layer 12 is omitted.

Figure 5:
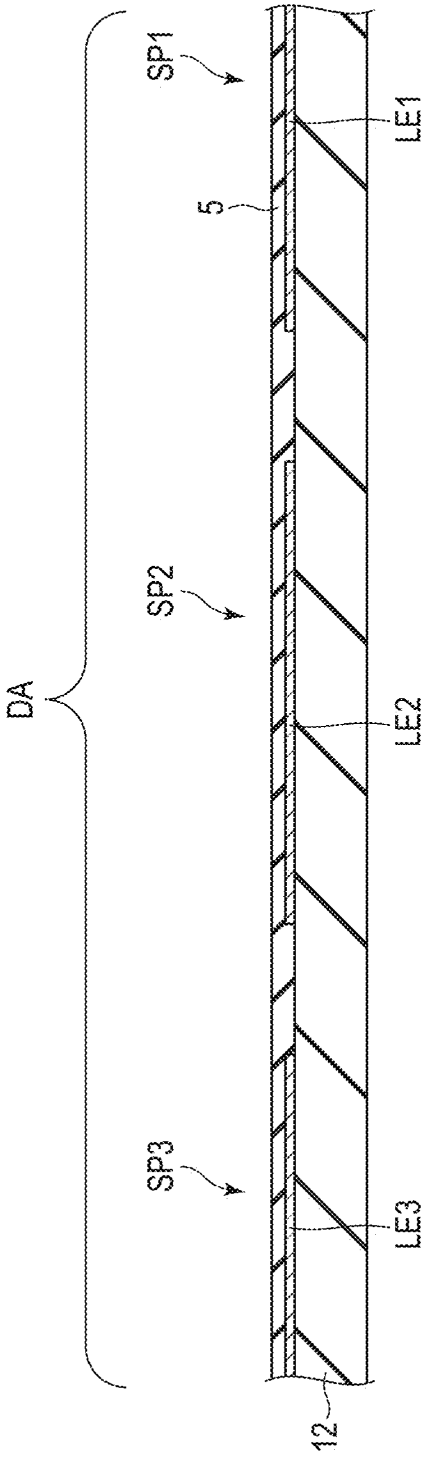
FIG. 5 is a diagram for explaining the manufacturing method of the display device DSP.

First, as shown in FIG. 5, the lower electrode LE1 of subpixel SP1, the lower electrode LE2 of subpixel SP2 and the lower electrode LE3 of subpixel SP3 are formed on the organic insulating layer 12.

Subsequently, the inorganic insulating layer 5 which covers the lower electrodes LE1, LE2 and LE3 is formed by depositing an inorganic insulating material. Here, to the inorganic insulating material, for example, silicon oxynitride (SiON) is applied. The inorganic insulating layer 5 is formed by, for example, chemical vapor deposition (CVD). The inorganic insulating layer 5 is formed in the surrounding area SA in addition to the display area DA.

Figure 6:
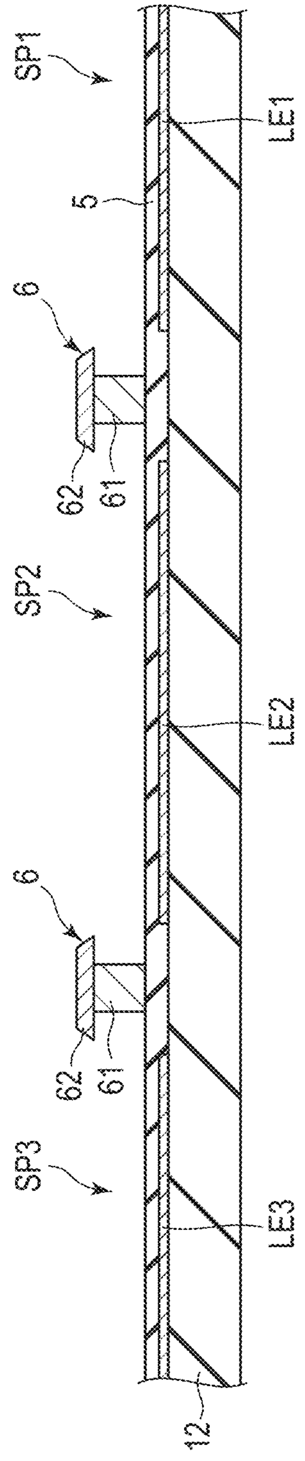
FIG. 6 is a diagram for explaining the manufacturing method of the display device DSP.

Subsequently, as shown in FIG. 6, the partition 6 which comprises the lower portion 61 located on the inorganic insulating layer 5 and formed of a conductive material and the upper portion 62 located on the lower portion 61 and protruding from the side surfaces of the lower portion 61 is formed.

In the process of forming the partition 6, first, a lower layer including a conductive layer is formed on the inorganic insulating layer 5. Subsequently, an upper layer is formed on the lower layer. The conductive layer of the lower layer is formed of a conductive material such as molybdenum or aluminum. The upper layer may be formed of a conductive material or may be formed of an insulating material.

Subsequently, the upper layer and the lower layer are patterned in order by performing etching using a resist located on the upper layer and having a predetermined shape as a mask. By this process, the partition 6 is formed. The lower portion 61 of the partition 6 is formed by patterning the lower layer. The upper portion 62 is formed by patterning the upper layer.

Figure 7:
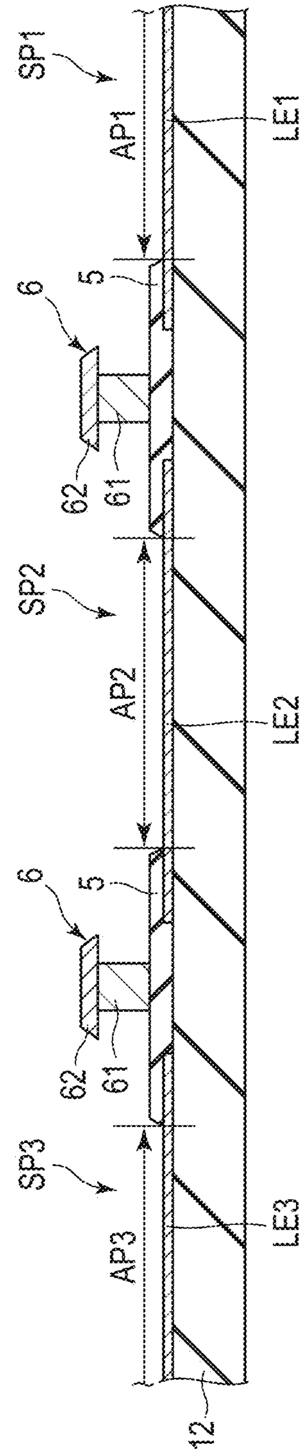
FIG. 7 is a diagram for explaining the manufacturing method of the display device DSP.

Subsequently, as shown in FIG. 7, the aperture AP1 from which the lower electrode LE1 is exposed, the aperture AP2 from which the lower electrode LE2 is exposed and the aperture AP3 from which the lower electrode LE3 is exposed are formed by patterning the inorganic insulating layer 5.

Subsequently, the display element 201 is formed.

Figure 8:
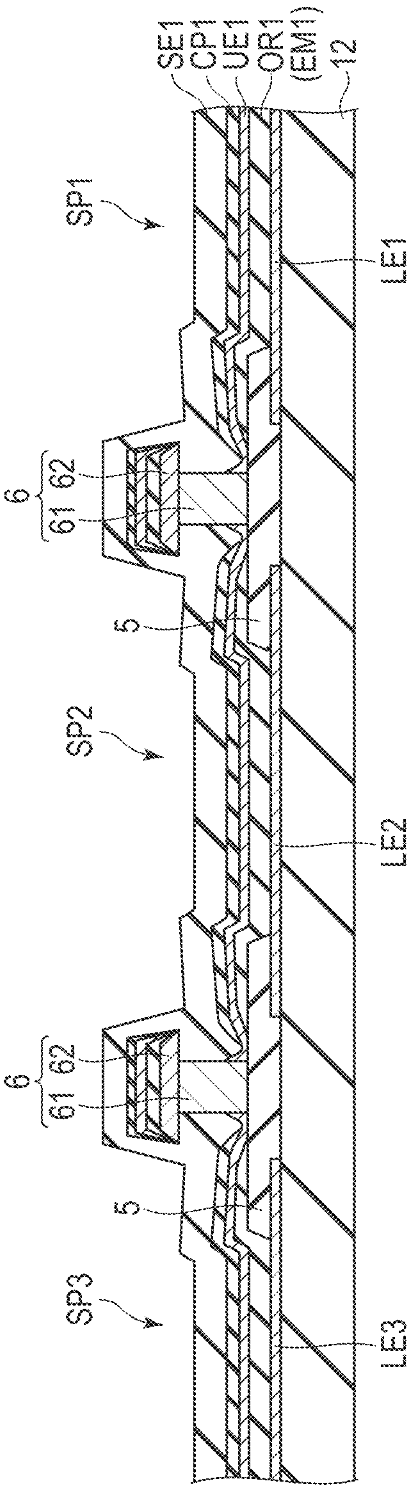
FIG. 8 is a diagram for explaining the manufacturing method of the display device DSP.

First, as shown in FIG. 8, the organic layer OR1 is formed by depositing the materials for forming the hole injection layer, the hole transport layer, the electron blocking layer, the light emitting layer (EM1), the hole blocking layer, the electron transport layer, the electron injection layer, etc., on the lower electrode LE1 in series using the partition 6 as a mask.

Subsequently, the upper electrode UE1 is formed by depositing a mixture of magnesium and silver on the organic layer OR1 using the partition 6 as a mask. The upper electrode UE1 covers the organic layer OR1 and is in contact with the lower portion 61.

Subsequently, the cap layer CP1 is formed by depositing a high-refractive material and a low-refractive material in order on the upper electrode UE1 using the partition 6 as a mask.

Subsequently, the sealing layer SE1 is formed so as to continuously cover the cap layer CP1 and the partition 6 by depositing an inorganic insulating material by CVD. Here, to the inorganic insulating material, for example, silicon nitride (SiN) is applied.

The organic layer OR1, the upper electrode UE1, the cap layer CP1 and the sealing layer SE1 are formed in at least the entire display area DA and are provided in subpixels SP2 and SP3 as well as subpixel SP1. The organic layer OR1, the upper electrode UE1 and the cap layer CP1 are divided by the partition 6 having an overhang shape.

The materials which are emitted from an evaporation source when the organic layer OR1, the upper electrode UE1 and the cap layer CP1 are formed by vapor deposition are blocked by the upper portion 62. Thus, each of the organic layer OR1, the upper electrode UE1 and the cap layer CP1 is partly stacked on the upper portion 62. The organic layer OR1, upper electrode UE1 and cap layer CP1 located on the upper portion 62 are spaced apart from the organic layer OR1, upper electrode UE1 and cap layer CP1 located immediately above the lower electrode LE1.

Figure 9:
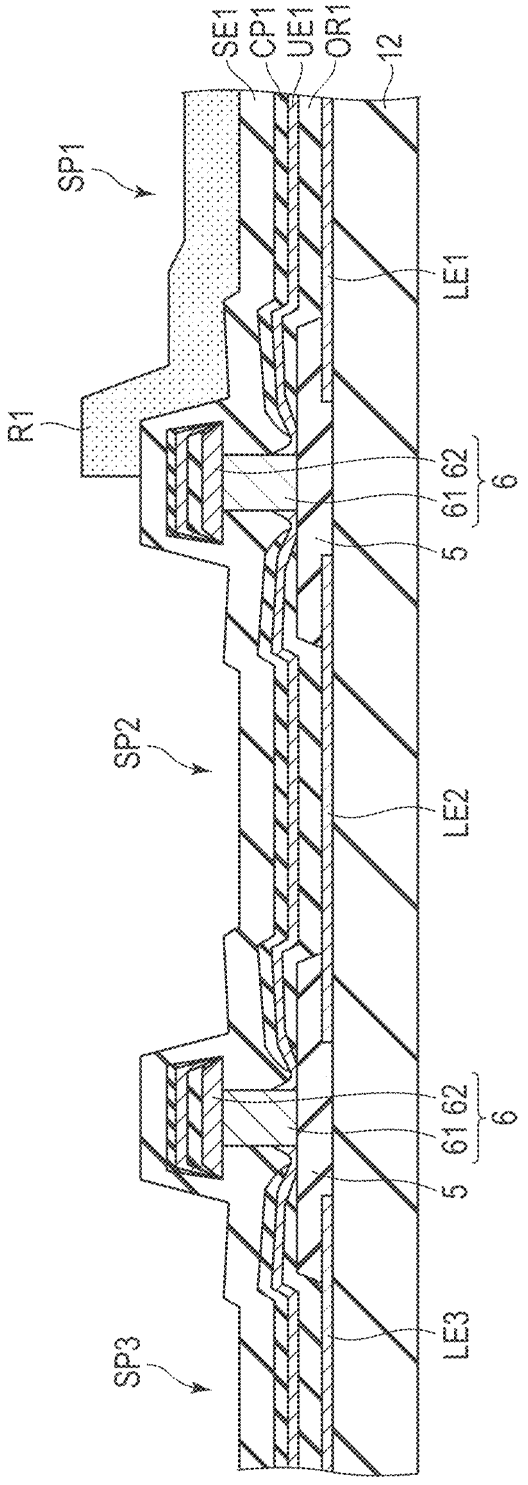
FIG. 9 is a diagram for explaining the manufacturing method of the display device DSP.

Subsequently, as shown in FIG. 9, a resist R1 having a predetermined shape is formed on the sealing layer SE1. The resist R1 overlaps subpixel SP1 and part of the partition 6 around subpixel SP1.

Figure 10:
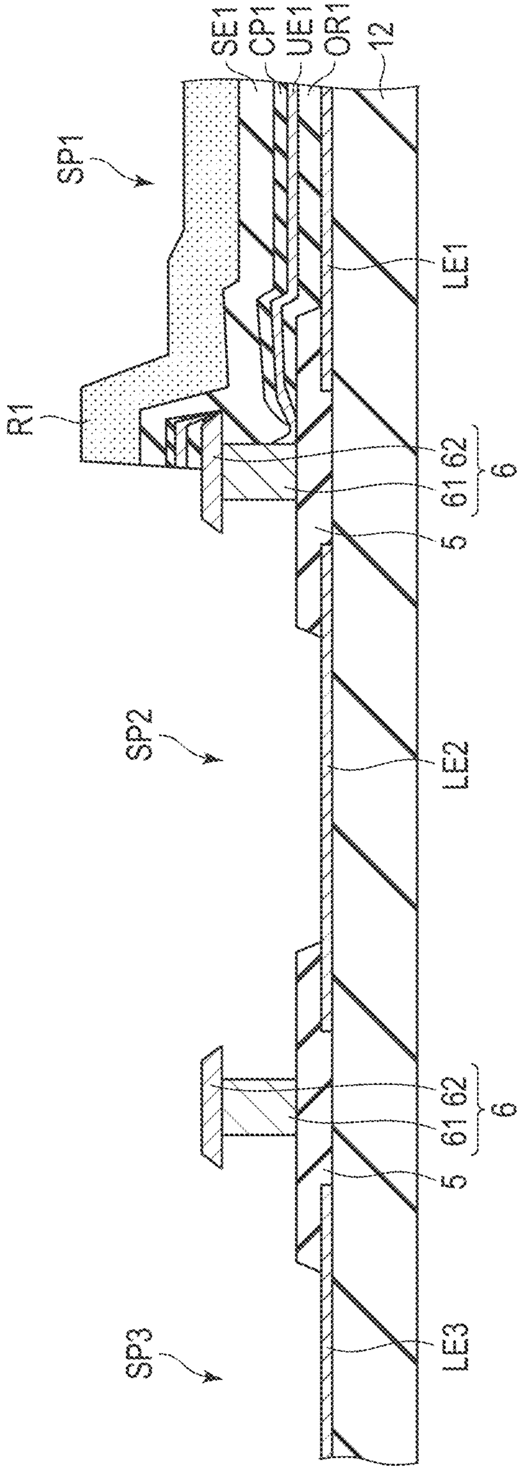
FIG. 10 is a diagram for explaining the manufacturing method of the display device DSP.

Subsequently, as shown in FIG. 10, the sealing layer SE1, cap layer CP1, upper electrode UE1 and organic layer OR1 exposed from the resist R1 are removed in series by performing etching using the resist R1 as a mask. In this manner, the lower electrode LE2 of subpixel SP2 and the lower electrode LE3 of subpixel SP3 are exposed.

Figure 11:
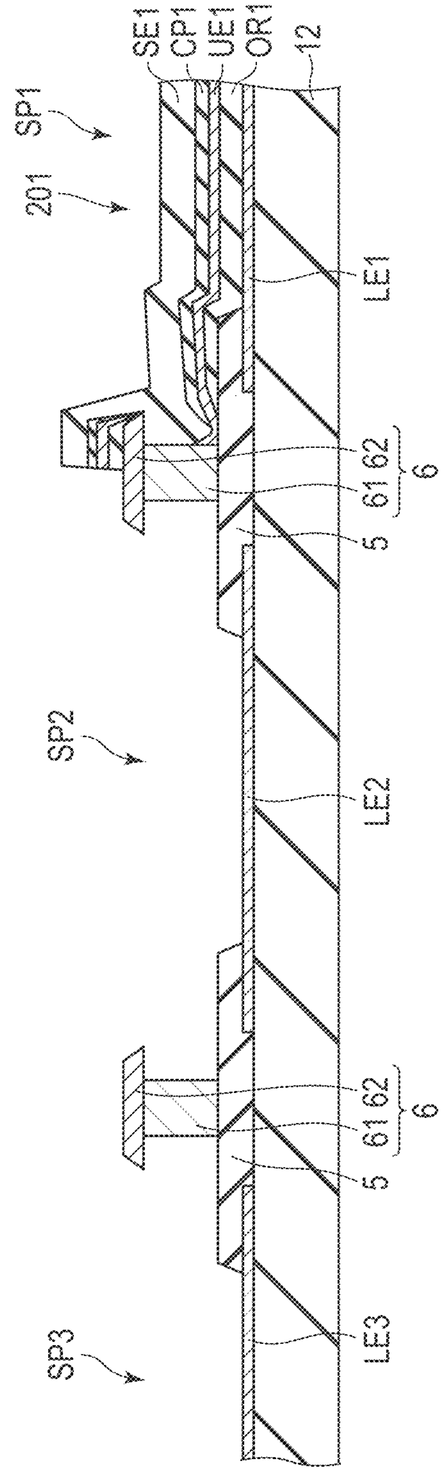
FIG. 11 is a diagram for explaining the manufacturing method of the display device DSP.

Subsequently, as shown in FIG. 11, the resist R1 is removed. By this process, the display element 201 is formed in subpixel SP1.

Figure 12:
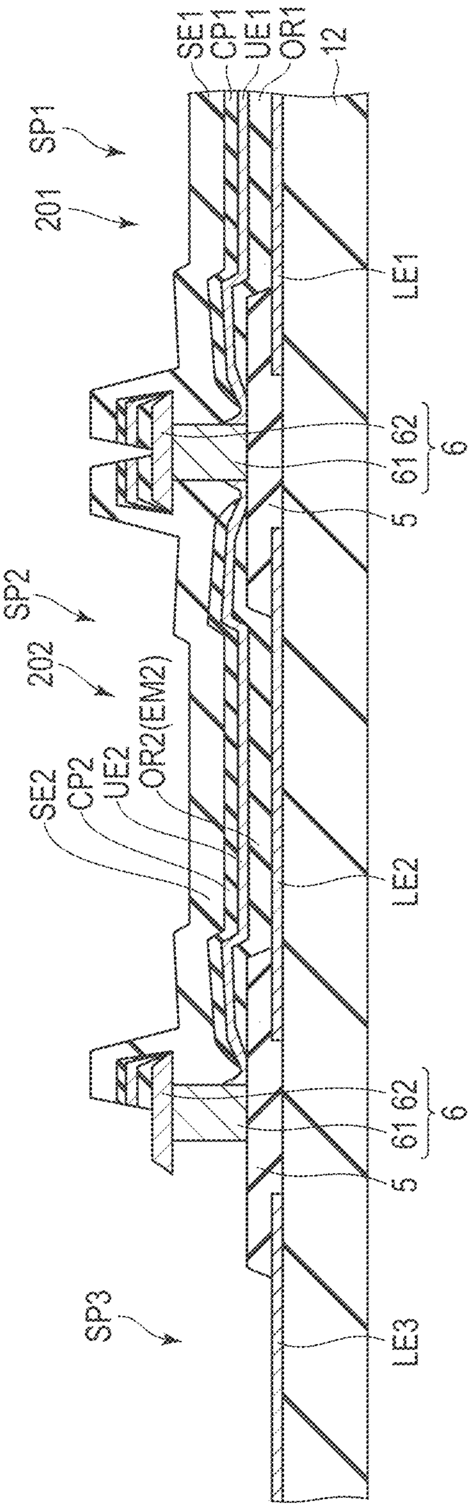
FIG. 12 is a diagram for explaining the manufacturing method of the display device DSP.

Subsequently, as shown in FIG. 12, the display element 202 is formed. The procedure of forming the display element 202 is similar to that of forming the display element 201. Specifically, the organic layer OR2 including the light emitting layer EM2, the upper electrode UE2, the cap layer CP2 and the sealing layer SE2 are formed in order on the lower electrode LE2. Subsequently, a resist is formed on the sealing layer SE2. The sealing layer SE2, the cap layer CP2, the upper electrode UE2 and the organic layer OR2 are patterned in series by performing etching using the resist as a mask. After this patterning, the resist is removed. In this manner, the display element 202 is formed in subpixel SP2, and the lower electrode LE3 of subpixel SP3 is exposed.

Figure 13:
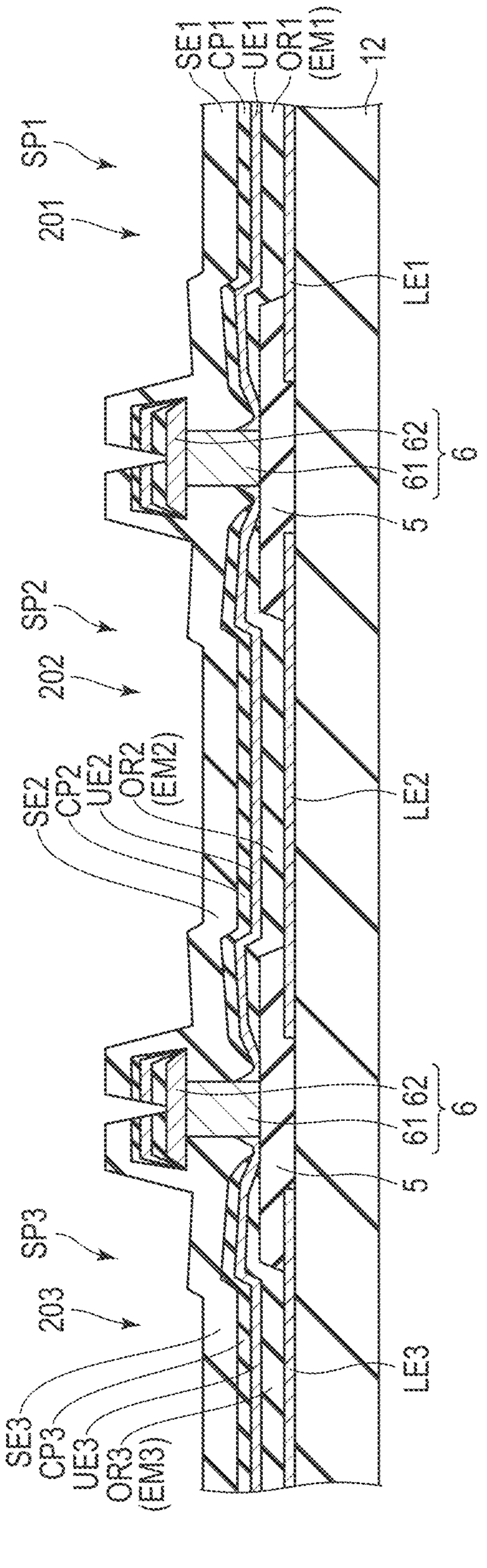
FIG. 13 is a diagram for explaining the manufacturing method of the display device DSP.

Subsequently, as shown in FIG. 13, the display element 203 is formed. The procedure of forming the display element 203 is similar to that of forming the display element 201. Specifically, the organic layer OR3 including the light emitting layer EM3, the upper electrode UE3, the cap layer CP3 and the sealing layer SE3 are formed in order on the lower electrode LE3. Subsequently, a resist is formed on the sealing layer SE3. The sealing layer SE3, the cap layer CP3, the upper electrode UE3 and the organic layer OR3 are patterned in series by performing etching using the resist as a mask. After this patterning, the resist is removed. By this process, the display element 203 is formed in subpixel SP3.

Subsequently, the resin layer 13, sealing layer 14 and resin layer 15 shown in FIG. 3 are formed in order. By this process, the display device DSP is completed.

In the manufacturing process described above, this specification assumes a case where the display element 201 is formed firstly, and the display element 202 is formed secondly, and the display element 203 is formed lastly. However, the formation order of the display elements 201, 202 and 203 is not limited to this example.

Now, this specification explains a mother substrate 100 for a display device (hereinafter, simply referred to as a mother substrate 100) for manufacturing a plurality of display devices DSP in a lump.

Figure 14:
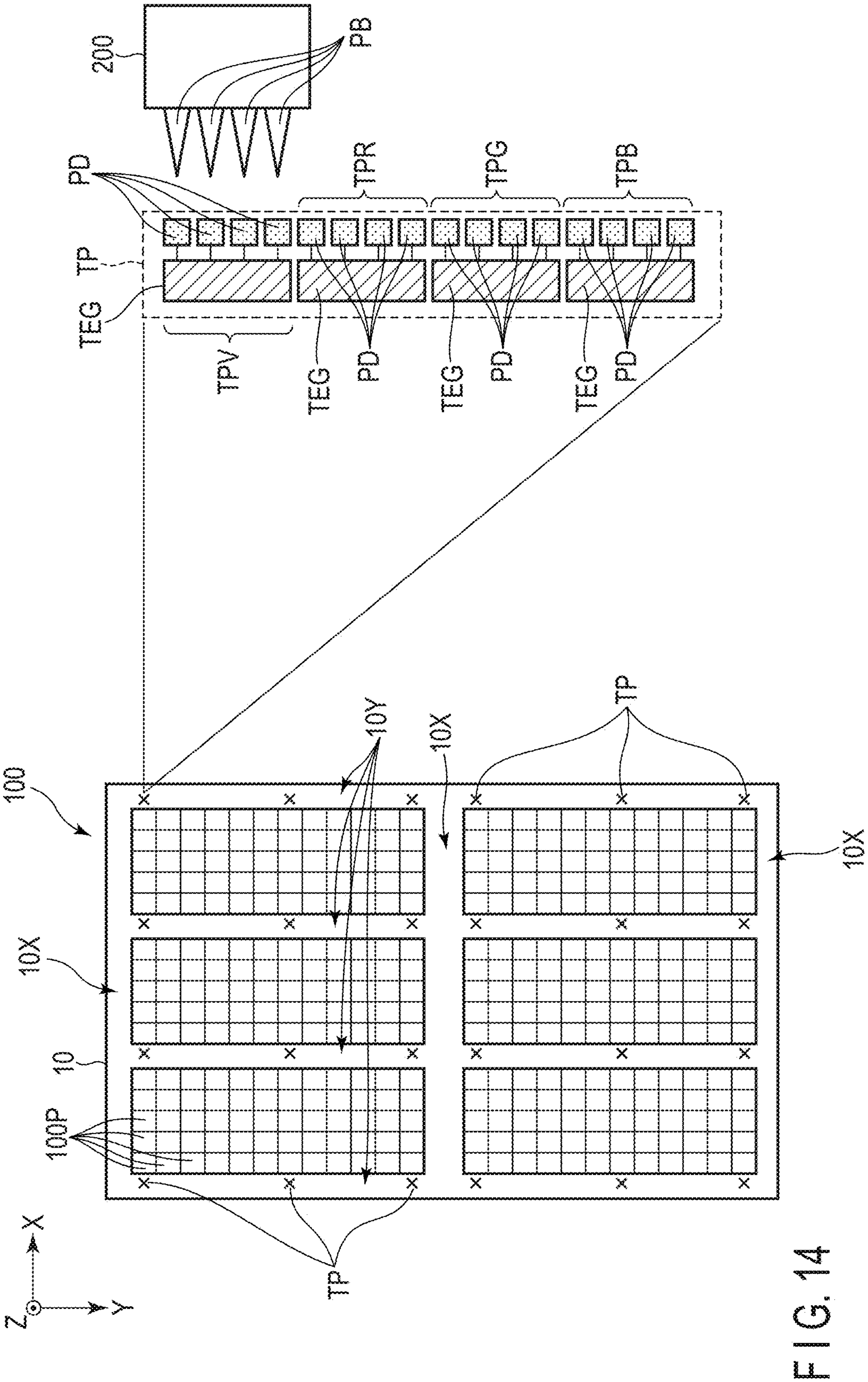
FIG. 14 is a plan view showing an example of a mother substrate 100.

FIG. 14 is a plan view showing an example of the mother substrate 100.

The mother substrate 100 comprises a plurality of panel portions 100P and a plurality of inspection portions TP on a large substrate 10. The panel portions 100P are arrayed in matrix in the first direction X and the second direction Y. The inspection portions TP are provided in a margin outside the panel portions 100P. In the example shown in the figure, the inspection portions TP are provided in margins 10Y extending in the second direction Y on the substrate 10.

Each panel portion 100P which is extracted by dividing the mother substrate 100 along cut lines corresponds to the display panel PNL shown in FIG. 1. Thus, each of the panel portions 100P comprises the display area DA and the surrounding area SA as shown in FIG. 1. Further, as shown in FIG. 3, each of the panel portions 100P comprises the circuit layer 11, the organic insulating layer 12, the inorganic insulating layer 5, the partition 6, the lower electrodes LE1, LE2 and LE3, the organic layers OR1, OR2 and OR3, the upper electrodes UE1, UE2 and UE3, the cap layers CP1, CP2 and CP3, the sealing layers SE1, SE2 and SE3, etc.

As shown in the enlarged view, each inspection portion TP comprises an inspection portion TPB corresponding to blue subpixels SP1, an inspection portion TPG corresponding to green subpixels SP2, an inspection portion TPR corresponding to red subpixels SP3 and an inspection portion TPV for confirmation. The inspection portions TPB, TPG, TPR and TPV are arranged in the second direction Y.

Each of the inspection portions TPB, TPG, TPR and TPV comprises a test element group TEG, and four pads PD electrically connected to the test element group TEG. The four pads PD are in contact with four probes PB provided in an inspection device 200, respectively. In the example shown in the figure, the four probes PB are arranged at regular pitches in the second direction Y. The four pads PD are arranged at regular pitches in the second direction Y. The pitch of the pads PD is equal to that of the probes PB.

The inspection portion TPB is used to manage the contact resistance between the partition 6 and the upper electrode UE1 in each subpixel SP1.

The inspection portion TPG is used to manage the contact resistance between the partition 6 and the upper electrode UE2 in each subpixel SP2.

The inspection portion TPR is used to manage the contact resistance between the partition 6 and the upper electrode UE3 in each subpixel SP3.

The inspection portion TPV is used to confirm the operation of the inspection device 200.

Each of the inspection portions TP provided in the mother substrate 100 is formed by the same specification as the inspection portion TP shown in the enlarged view.

In the example shown in the figure, the inspection portions TPB, TPG, TPR and TPV are arranged in a single line in the second direction Y. However, they may be arranged in a plurality of lines.

When the probes PB of the inspection device 200 are arranged in the first direction X, a layout in which the pads PD of each of the inspection portions TPB, TPG, TPR and TPV are arranged in the first direction X may be applied. In this case, to reduce the area of the margin of the substrate 10, the inspection portions TP should be preferably provided in margins 10X extending in the first direction X on the substrate 10.

Figure 15:
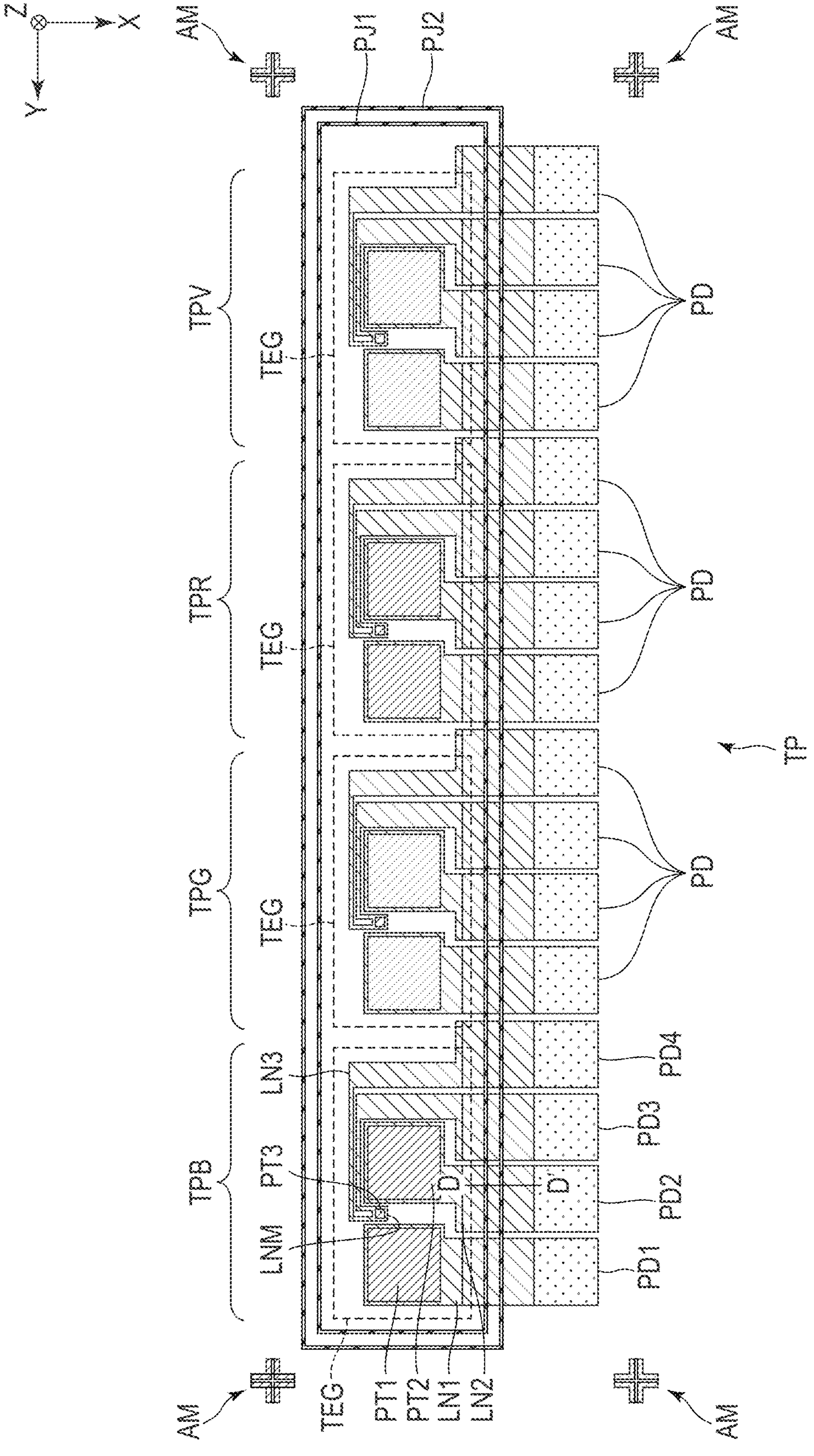
FIG. 15 is a plan view in which an inspection portion TP is enlarged.

FIG. 15 is a plan view in which an inspection portion TP is enlarged.

An alignment mark AM is provided at four positions around the inspection portions TPB, TPG, TPR and TPV. The alignment marks AM are used to, for example, align the probes PB of the inspection device 200 shown in FIG. 14 with the pads PD of each inspection portion.

The test element group TEG of each of the inspection portions TPB, TPG, TPR and TPV is surrounded by a projecting body PJ1 formed like a loop. The projecting body PJ1 is surrounded by another projecting body PJ2 formed like a loop. The projecting body PJ1 is spaced apart from the projecting body PJ2.

The pads PD of each of the inspection portions TPB, TPG, TPR and TPV are located outside the projecting bodies PJ1 and PJ2.

Here, the inspection portion TPB is more specifically explained.

In the inspection portion TPB, pads PD1, PD2, PD3 and PD4 are arranged in order at regular pitches in the second direction Y. The test element group TEG comprises a line portion LN1 electrically connected to the pad PD1, a line portion LN2 electrically connected to the pad PD2, and a line portion LN3 electrically connected to the pad PD3 and the pad PD4. The line portion LN3 comprises a middle portion LNM located between the line portion LN1 and the line portion LN2.

The test element group TEG further comprises partition patterns PT1, PT2 and PT3.

The partition pattern PT1 overlaps the line portion LN1.

The partition pattern PT2 overlaps the line portion LN2. As described in detail later, the partition pattern PT2 is connected with the partition pattern PT1.

The partition pattern PT3 overlaps the middle portion LNM of the line portion LN3.

These partition patterns PT1, PT2 and PT3 are formed by the same process as the partition 6 of the display area DA shown in FIG. 3. The partition patterns PT1, PT2 and PT3 are surrounded by the projecting body PJ1.

The pads PD1, PD2, PD3 and PD4 are located outside the projecting bodies PJ1 and PJ2. The line portions LN1, LN2 and LN3 and the partition patterns PT1, PT2 and PT3 are surrounded by the projecting body PJ1.

Although detailed explanation is omitted, the other inspection portions TPG, TPR and TPV are configured in a manner similar to that of the inspection portion TPB.

Figure 16:
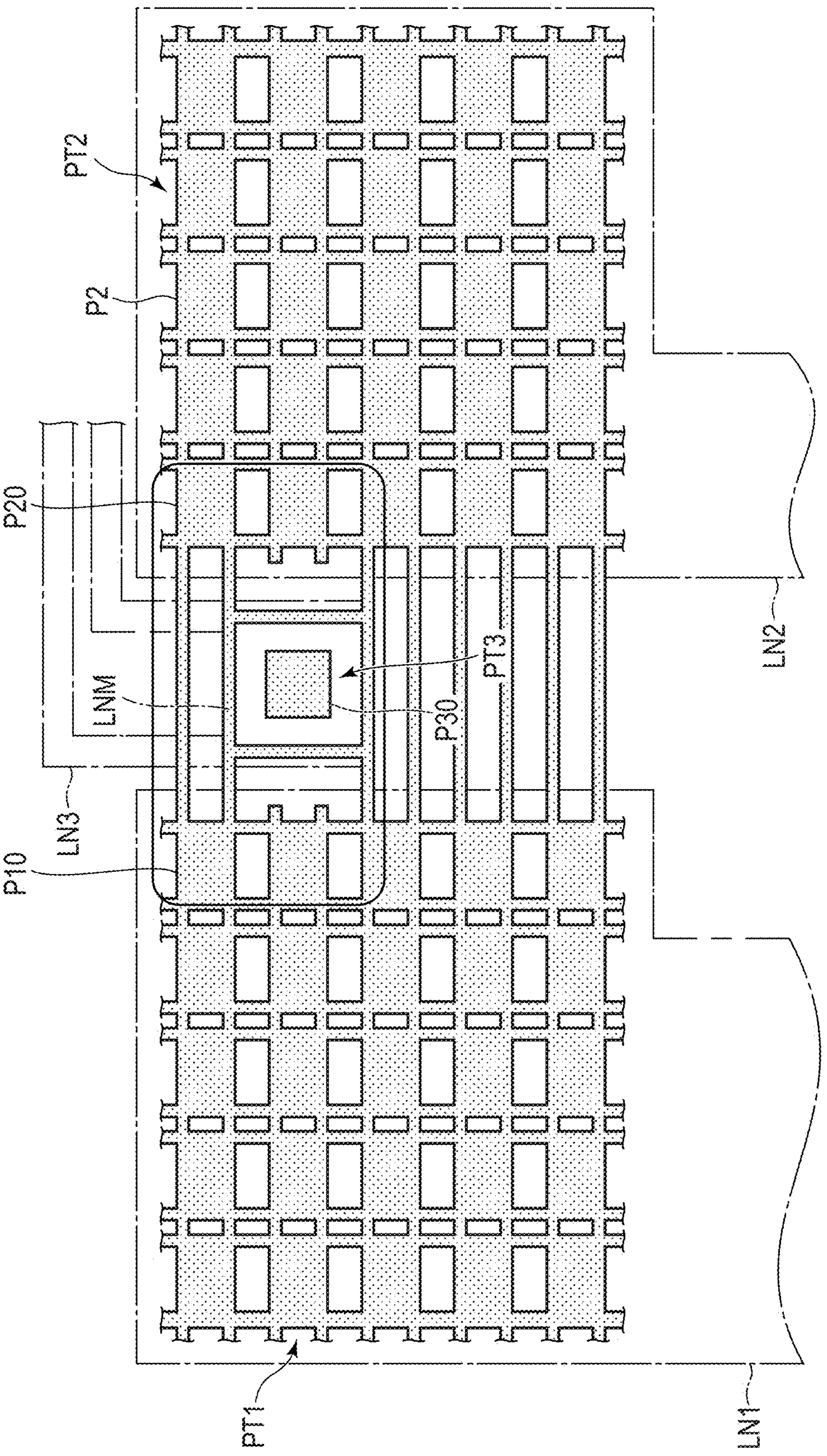
FIG. 16 is a plan view showing examples of partition patterns PT1, PT2 and PT3.

FIG. 16 is a plan view showing examples of the partition patterns PT1, PT2 and PT3. The line portions LN1, LN2 and LN3 are shown by alternate long and short dash lines.

The partition pattern PT1 is formed into a grating shape. The partition pattern PT1 comprises a partition P10 at a position which is adjacent to the middle portion LNM.

The partition pattern PT2 is formed into a grating shape. The partition pattern PT2 comprises a partition P20 at a position which is adjacent to the middle portion LNM. The partition pattern PT1 and the partition pattern PT2 are integrally formed and are connected with each other.

The partition pattern PT3 comprises a partition P30 overlapping the middle portion LNM and having an island-like shape. The partition P30 is spaced apart from the partition patterns PT1 and PT2.

Figure 17:
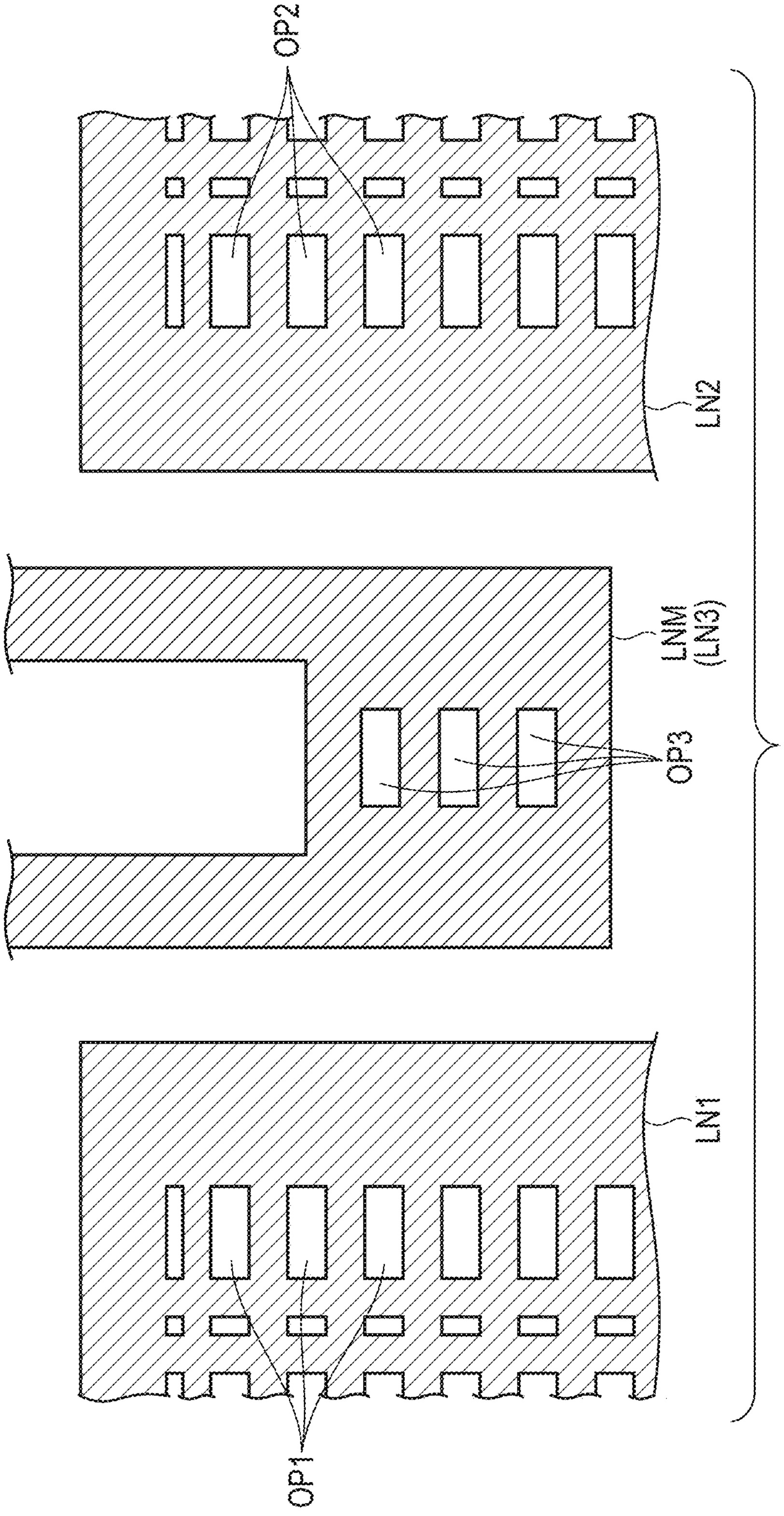
FIG. 17 is a plan view showing examples of line portions LN1, LN2 and LN3.

FIG. 17 is a plan view showing examples of the line portions LN1, LN2 and LN3. Here, part of the line portions LN1, LN2 and LN3 in the area surrounded by the solid line of FIG. 16 is shown.

The line portion LN1 comprises a plurality of opening portions OP1 and is formed into a grating shape.

The line portion LN2 comprises a plurality of opening portions OP2 and is formed into a grating shape.

The middle portion LNM of the line portion LN3 comprises a plurality of opening portions OP3.

The partition patterns PT1, PT2 and PT3 shown in FIG. 16 overlap the line portions LN1, LN2 and LN3 shown in FIG. 17, respectively.

Figure 18:
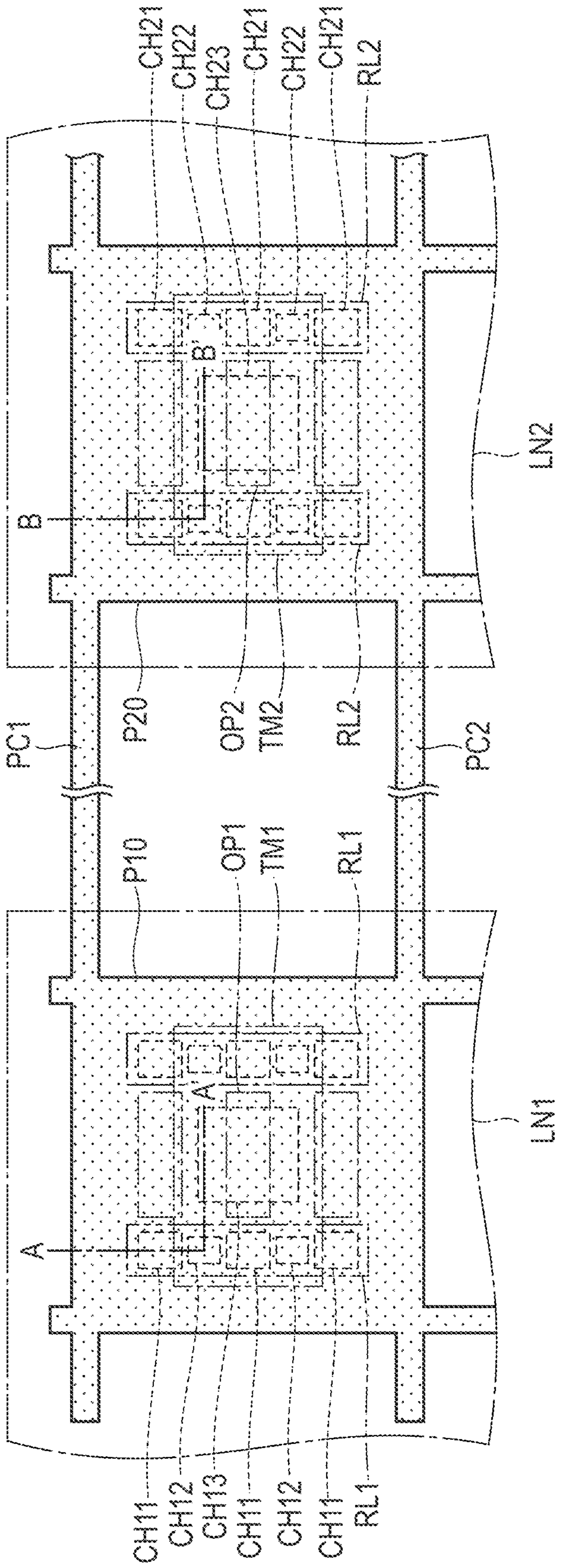
FIG. 18 is a plan view showing examples of partitions P10 and P20.

FIG. 18 is a plan view showing examples of the partitions P10 and P20. Here, the illustration of the middle portion LNM is omitted, and the line portions LN1 and LN2 are shown by alternate long and short dash lines.

A relay electrode RL1 and a terminal TM1 are located between the line portion LN1 and the partition P10. The relay electrode RL1 shown by alternate long and two short dashes lines is in contact with the line portion LN1 via a contact hole CH11. The terminal TM1 shown by broken lines overlaps the opening portion OP1 of the line portion LN1 and is in contact with the relay electrode RL1 via a contact hole CH12. The partition P10 is in contact with the terminal TM1 via a contact hole CH13. By this configuration, the partition P10 is electrically connected to the line portion LN1 via the terminal TM1 and the relay electrode RL1.

A relay electrode RL2 and a terminal TM2 are located between the line portion LN2 and the partition P20. The relay electrode RL2 shown by alternate long and two short dashes lines is in contact with the line portion LN2 via a contact hole CH21. The terminal TM2 shown by the broken lines overlaps the opening portion OP2 of the line portion LN2 and is in contact with the relay electrode RL2 via a contact hole CH22. The partition P20 is in contact with the terminal TM2 via a contact hole CH23. By this configuration, the partition P20 is electrically connected to the line portion LN2 via the terminal TM2 and the relay electrode RL2.

The partition P10 and the partition P20 are electrically connected to each other via partitions PC1 and PC2 for connection. The partitions P10, P20, PC1 and PC2 are integrally formed. By this configuration, the line portion LN1 is electrically connected to the line portion LN2.

Figure 19:
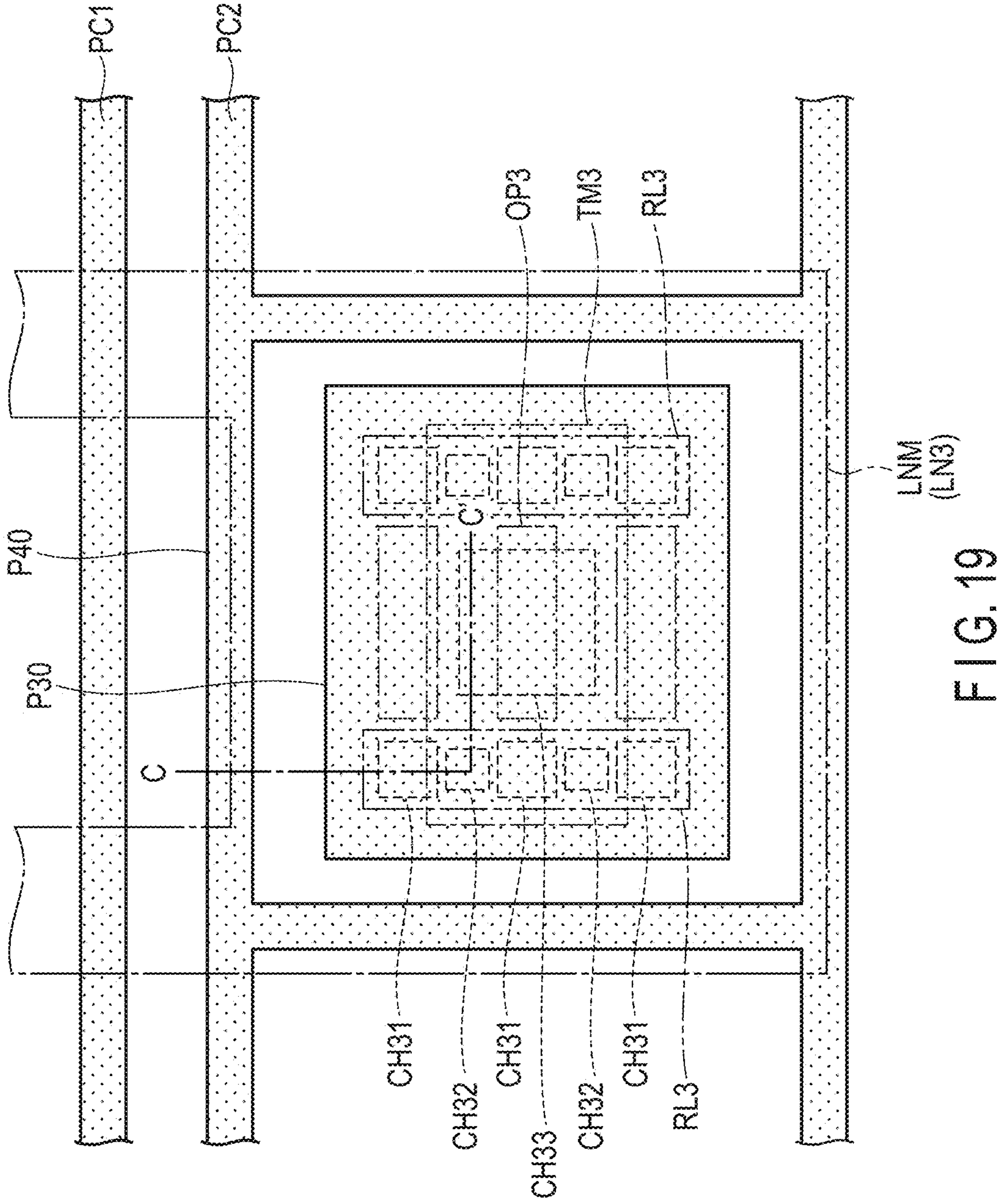
FIG. 19 is a plan view showing an example of a partition P30.

FIG. 19 is a plan view showing an example of the partition P30.

A relay electrode RL3 and a terminal TM3 are located between the middle portion LNM of the line portion LN3 and the partition P30. The relay electrode RL3 shown by alternate long and two short dashes lines is in contact with the line portion LN3 via a contact hole CH31. The terminal TM3 shown by broken lines overlaps the opening portion OP3 of the line portion LN3 and is in contact with the relay electrode RL3 via a contact hole CH32. The partition P30 is in contact with the terminal TM3 via a contact hole CH33. By this configuration, the partition P30 is electrically connected to the line portion LN3 via the terminal TM3 and the relay electrode RL3.

The partition P30 is surrounded by a partition P40 formed like a loop. The partition P40 overlaps the middle portion LNM. The partition P40 is formed integrally with the partition PC2 for connection shown in FIG. 18. Thus, the partition P40 is electrically connected to the line portions LN1 and LN2, the terminals TM1 and TM2 and the partitions P10 and P20. The partition P30 is spaced apart from the partition P40. Thus, the line portion LN3 is not electrically connected to the line portion LN1 or LN2.

Figure 20:
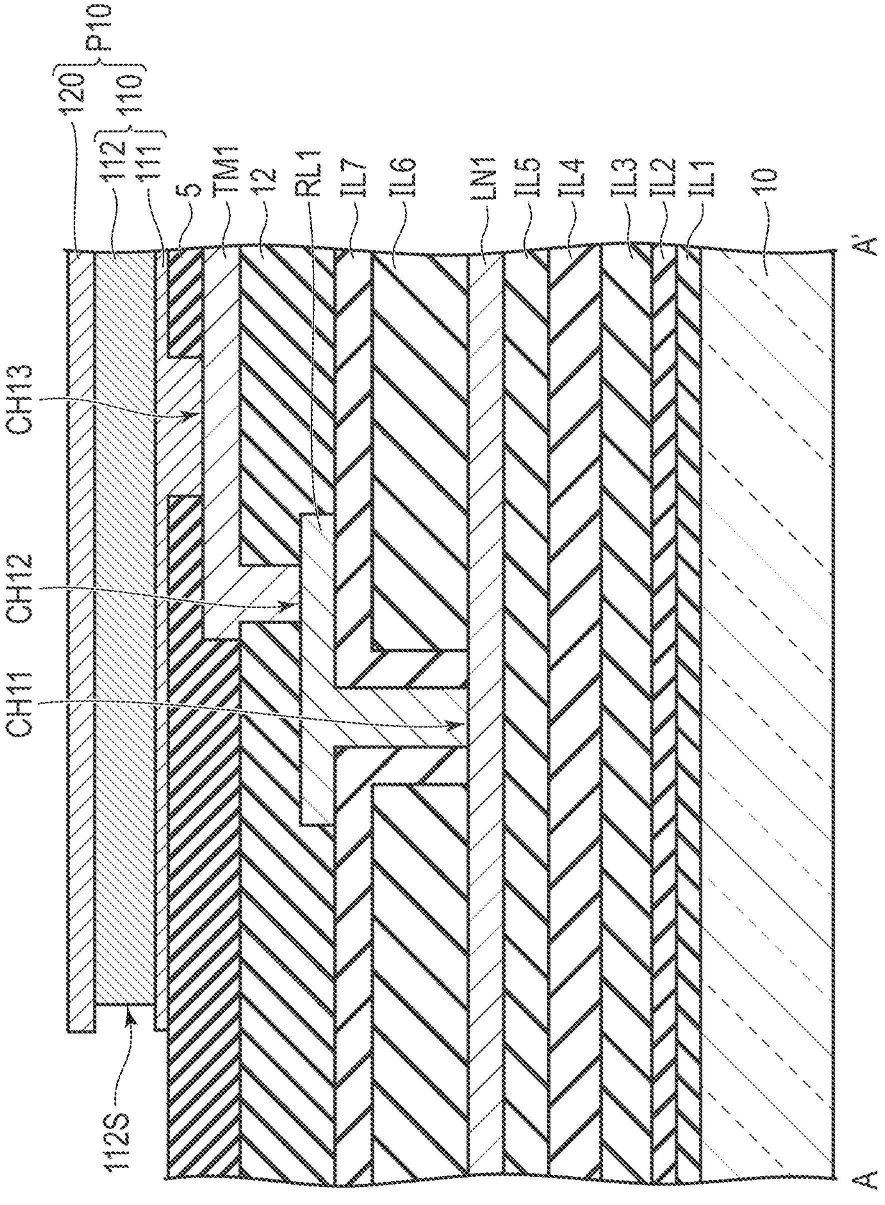
FIG. 20 is a cross-sectional view including the partition P10 along the A-A' line of FIG. 18.

FIG. 20 is a cross-sectional view including the partition P10 along the A-A' line of FIG. 18.

An insulating layer IL1 is provided on the substrate 10. An insulating layer IL2 is provided on the insulating layer IL1. An insulating layer IL3 is provided on the insulating layer IL2. An insulating layer IL4 is provided on the insulating layer IL3. An insulating layer IL5 is provided on the insulating layer IL4.

The line portion LN1 is provided on the insulating layer IL5. An insulating layer IL6 is provided on the line portion LN1. An insulating layer IL7 is provided on the insulating layer IL6.

The relay electrode RL1 is provided on the insulating layer IL7 and is in contact with the line portion LN1 in the contact hole CH11 penetrating the insulating layers IL6 and IL7. The organic insulating layer 12 is provided on the relay electrode RL1 and the insulating layer IL7.

The terminal TM1 is provided on the organic insulating layer 12 and is in contact with the relay electrode RL1 in the contact hole CH12 penetrating the organic insulating layer 12. The inorganic insulating layer 5 is provided on the terminal TM1 and the organic insulating layer 12.

The lower portion 110 of the partition P10 is provided on the inorganic insulating layer 5 and is in contact with the terminal TM1 in the contact hole CH13 penetrating the inorganic insulating layer 5. By this configuration, the partition P10 is electrically connected to the line portion LN1.

In the example shown in the figure, the lower portion 110 comprises a bottom layer 111 and a stem portion 112. The bottom layer 111 is provided on the inorganic insulating layer 5 and is in contact with the terminal TM1 in the contact hole CH13. The stem portion 112 is provided on the bottom layer 111. An upper portion 120 is provided on the stem portion 112. The bottom layer 111 and the upper portion 120 protrude from a side surface 112S of the stem portion 112.

Each of the insulating layers IL1, IL2, IL3, IL4, IL5 and IL7 is an inorganic insulating layer formed of silicon nitride or silicon oxide. The insulating layer IL6 is an organic insulating layer. The insulating layers IL1 to IL7 extend in the panel portions 100P as well and are included in the circuit layer 11 shown in FIG. 3.

Each of the line portion LN1 and the relay electrode RL1 is formed of a stacked layer body of a molybdenum layer and an aluminum layer or a stacked layer body of a titanium layer and an aluminum layer.

The terminal TM1 is formed of the same material as the lower electrode LE1, etc.

As the section including the partition P20 along the B-B' line of FIG. 18 is substantially the same as the section shown in FIG. 20, explanation thereof is omitted.

Figure 21:
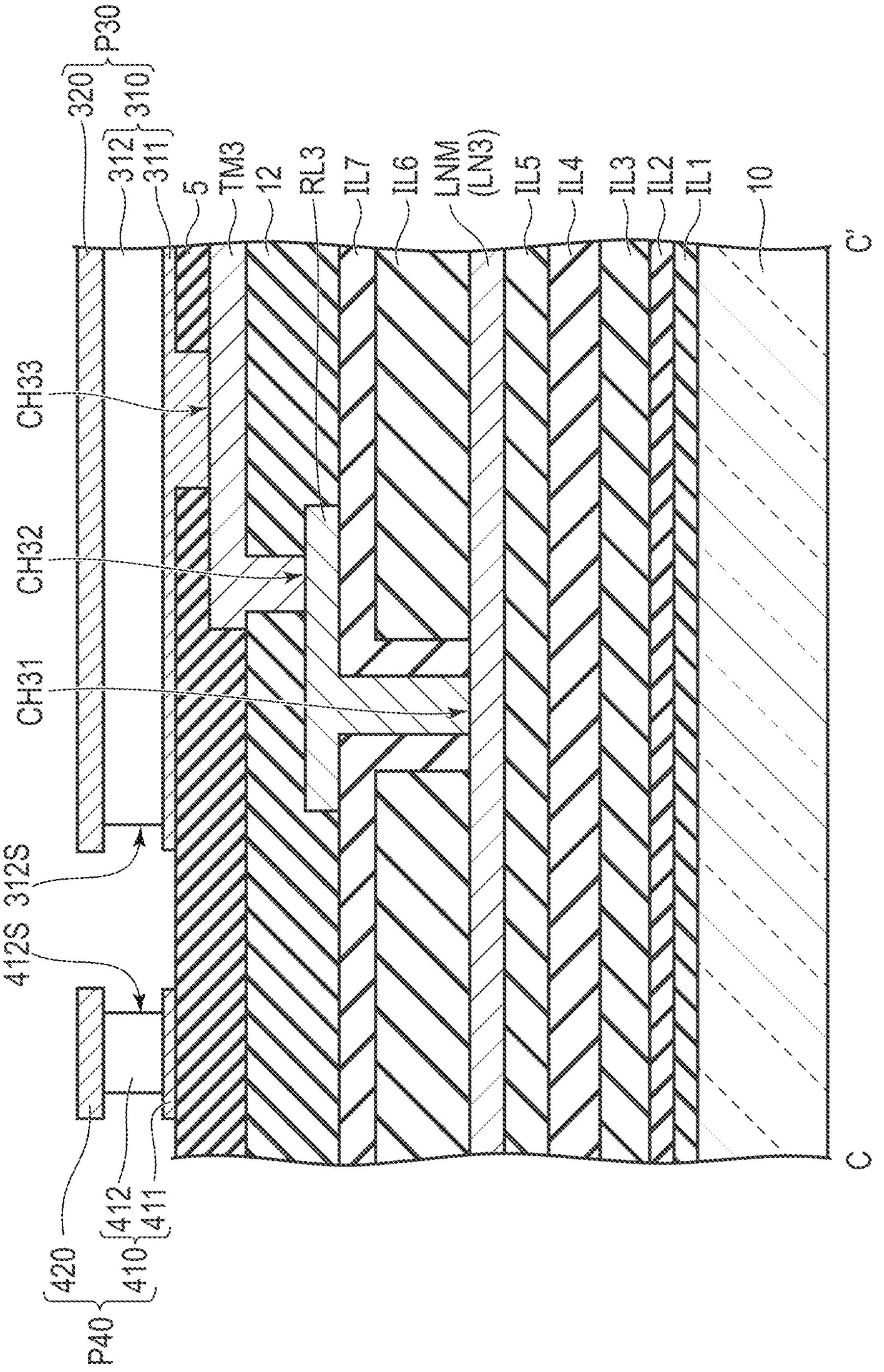
FIG. 21 is a cross-sectional view including the partitions P30 and P40 along the C-C' line of FIG. 19.

FIG. 21 is a cross-sectional view including the partitions P30 and P40 along the C-C' line of FIG. 19.

The line portion LN3 including the middle portion LNM is provided on the insulating layer IL5.

The relay electrode RL3 is provided on the insulating layer IL7 and is in contact with the line portion LN3 in the contact hole CH31 penetrating the insulating layers IL6 and IL7.

The terminal TM3 is provided on the organic insulating layer 12 and is in contact with the relay electrode RL3 in the contact hole CH32 penetrating the organic insulating layer 12.

The lower portion 310 of the partition P30 is provided on the inorganic insulating layer 5 and is in contact with the terminal TM3 in the contact hole CH33 penetrating the inorganic insulating layer 5. By this configuration, the partition P30 is electrically connected to the middle portion LNM.

In the example shown in the figure, the lower portion 310 comprises a bottom layer 311 and a stem portion 312. The bottom layer 311 is provided on the inorganic insulating layer 5 and is in contact with the terminal TM3 in the contact hole CH33. The stem portion 312 is provided on the bottom layer 311. An upper portion 320 is provided on the stem portion 312. The bottom layer 311 and the upper portion 320 protrude from a side surface 312S of the stem portion 312.

As described above, the partition P40 electrically connected to the line portions LN1 and LN2 is spaced apart from the partition P30.

The lower portion 410 of the partition P40 is provided on the inorganic insulating layer 5 and is spaced apart from the lower portion 310 of the partition P30. The lower portion 410 comprises a bottom layer 411 and a stem portion 412 in a manner similar to that of the lower portion 310.

The stem portion 412 is provided on the bottom layer 411. An upper portion 420 is provided on the stem portion 412. The bottom layer 411 and the upper portion 420 protrude from a side surface 412S of the stem portion 412.

Each of the line portion LN3 and the relay electrode RL3 is formed of a stacked layer body of a molybdenum layer and an aluminum layer or a stacked layer body of a titanium layer and an aluminum layer.

The terminal TM3 is formed of the same material as the terminals TM1 and TM2, the pads PD1, PD2, PD3 and PD4, the lower electrode LE1, etc., and is a multilayer body including a transparent electrode and a metal electrode.

Figure 22:
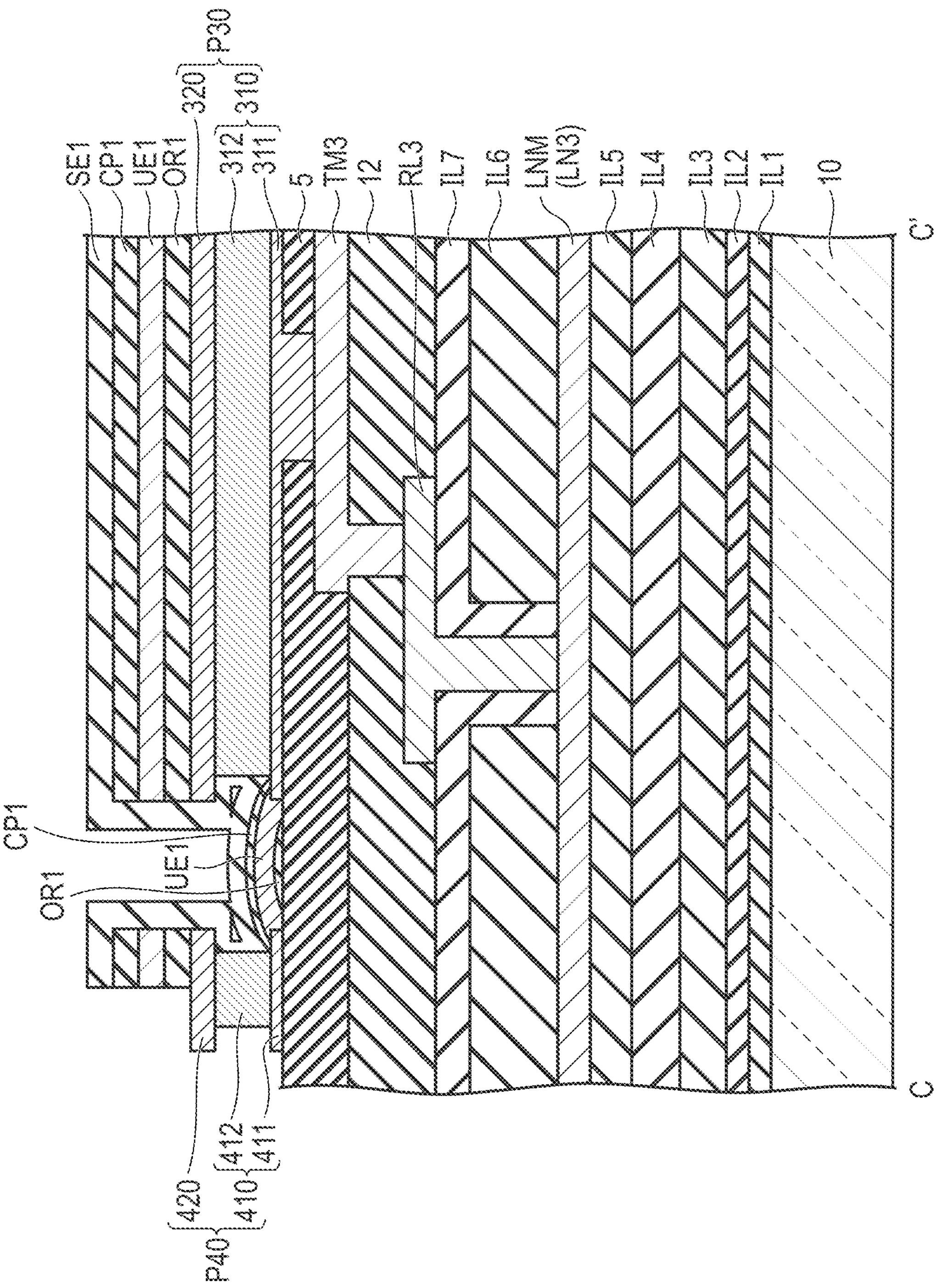
FIG. 22 is another cross-sectional view including the partitions P30 and P40 along the C-C' line of FIG. 19.

FIG. 22 is another cross-sectional view including the partitions P30 and P40 along the C-C' line of FIG. 19.

The section of FIG. 22 shows a state in which the organic layer OR1, the upper electrode UE1, the cap layer CP1 and the sealing layer SE1 are formed through the formation process of the display element 201 explained with reference to FIG. 8 to FIG. 11.

The organic layer OR1, the upper electrode UE1, the cap layer CP1 and the sealing layer SE1 are provided on each of the partitions P30 and P40 and are also provided between the partition P30 and the partition P40.

The organic layer OR1 is provided on the inorganic insulating layer 5 between the partition P30 and the partition P40. The upper electrode UE1 covers the organic layer OR1, and is in contact with the lower portion 310 of the partition P30 or the bottom layer 311, and is further in contact with the lower portion 410 of the partition P40 or the bottom layer 411. Thus, the partitions P30 and P40 spaced apart from each other are electrically connected to each other via the upper electrode UE1. The cap layer CP1 is provided on the upper electrode UE1. The sealing layer SE1 covers the cap layer CP1 and is in contact with the partitions P30 and P40.

The partitions P30 and P40 are formed in a manner similar to that of the partition 6 shown in FIG. 3. The upper electrode UE1 located between the partition P30 and the partition P40 is formed in a manner similar to that of the upper electrode UE1 shown in FIG. 3. Thus, the contact resistance between the upper electrode UE1 and the partition 6 in subpixel SP1 can be substantially confirmed by measuring the resistance between the partition P30 and the partition P40 via the upper electrode UE1.

Figure 23:
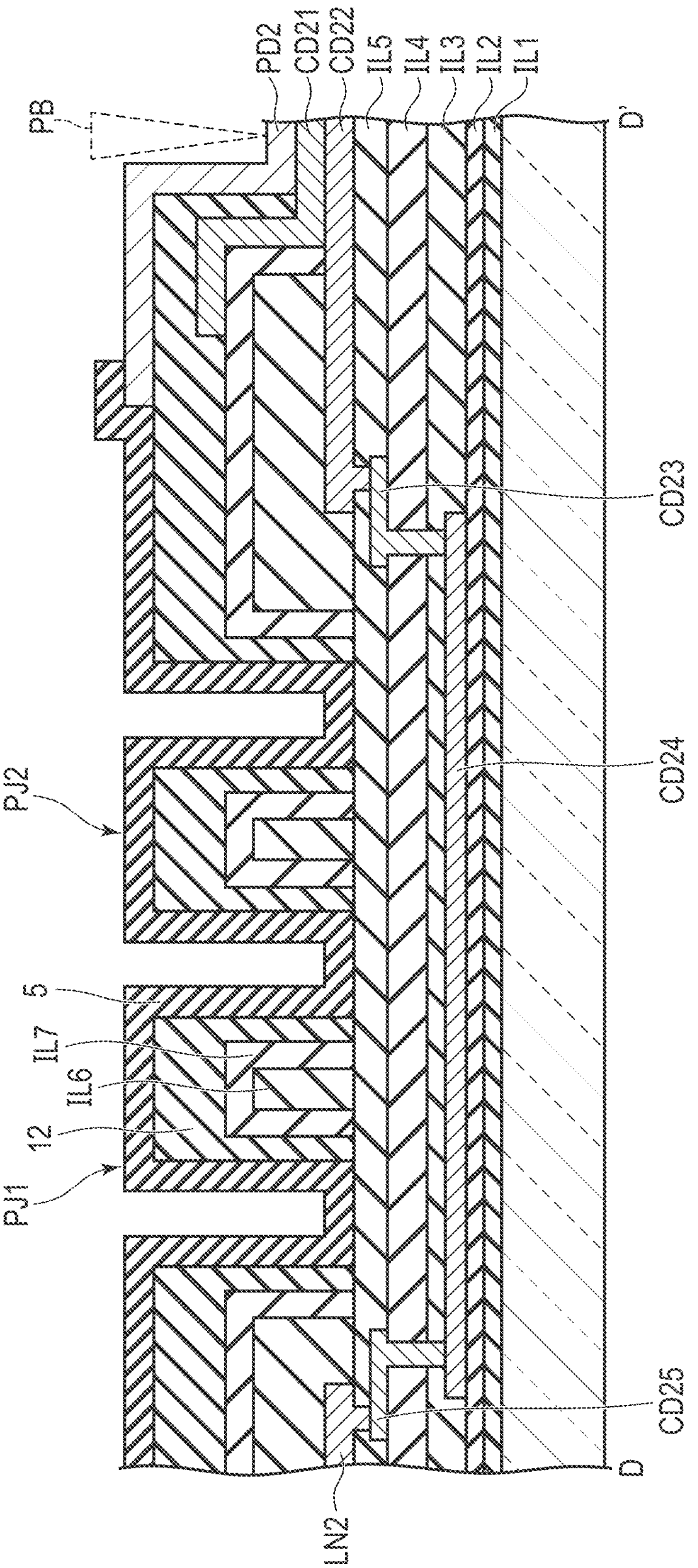
FIG. 23 is a cross-sectional view including projecting bodies PJ1 and JP2 along the D-D' line of FIG. 15.

FIG. 23 is a cross-sectional view including the projecting bodies PJ1 and JP2 along the D-D' line of FIG. 15.

Each of the projecting bodies PJ1 and PJ2 is formed of the insulating layers IL6 and IL7, the organic insulating layer 12 and the inorganic insulating layer 5. Each of the insulating layers IL6 and IL7 and the organic insulating layer 12 is discontinuously formed. The inorganic insulating layer 5 is in contact with the insulating layer IL5 between the pad PD2 and the projecting body PJ2, between the projecting body PJ2 and the projecting body PJ1 and between the projecting body PJ1 and the line portion LN2.

These projecting bodies PJ1 and PJ2 comprise a function to dam up the resin layers 13 and 15 shown in FIG. 3.

For example, in the test element group TEG of the inspection portion TPB shown in FIG. 15, in a manner similar to that of the display element 201, the organic layer OR1, the upper electrode UE1, the cap layer CP1 and the sealing layer SE1 are formed. In the test element group TEG of the inspection portion TPG, in a manner similar to that of the display element 202, the organic layer OR2, the upper electrode UE2, the cap layer CP2 and the sealing layer SE2 are formed. In the test element group TEG of the inspection portion TPR, in a manner similar to that of the display element 203, the organic layer OR3, the upper electrode UE3, the cap layer CP3 and the sealing layer SE3 are formed. Of these thin films, various evaporated films formed by evaporating materials are covered with the resin layer 13, sealing layer 14 and resin layer 15 shown in FIG. 3 to prevent removal from the substrate. As the test element group TEG is surrounded by the projecting bodies PJ1 and PJ2, the projecting bodies PJ1 and PJ2 prevent expansion of the resin layers 13 and 15 applied onto the test element group TEG until the resin layers are cured.

The pad PD2 is electrically connected to the line portion LN2 via conductive layers CD21 to CD25.

The conductive layer CD24 is located between the insulating layer IL2 and the insulating layer IL3 and intersects with the projecting bodies PJ1 and PJ2.

The conductive layer CD23 is located between the insulating layer IL4 and the insulating layer IL5 between the pad PD2 and the projecting body PJ2 and is in contact with the conductive layer CD24 in a contact hole penetrating the insulating layers IL3 and IL4.

The conductive layer CD25 is located between the insulating layer IL4 and the insulating layer IL5 between the projecting body PJ1 and the line portion LN2 and is in contact with the conductive layer CD24 in a contact hole penetrating the insulating layers IL3 and IL4.

The conductive layer CD22 and the line portion LN2 are located between the insulating layer IL5 and the insulating layer IL6 and are formed of the same material as the line portion LN1, etc. The conductive layer CD22 is in contact with the conductive layer CD23 in a contact hole penetrating the insulating layer IL5. The line portion LN2 is in contact with the conductive layer CD25 in a contact hole penetrating the insulating layer IL5.

The conductive layer CD21 is formed of the same material as the relay electrode RL1, etc., and is in contact with the conductive layer CD22.

The pad PD2 is formed of the same material as the terminal TM1, etc., and is in contact with the conductive layer CD21. The pad PD2 is exposed from the inorganic insulating layer 5 and can be in contact with the probes PB of the inspection device 200.

The connection structure between the pad PD1 and the line portion LN1 shown in FIG. 15, the connection structure between the pad PD3 and the line portion LN3 and the connection structure between the pad PD4 and the line portion LN3 are similar to the connection structure between the pad PD2 and the line portion LN2. Thus, explanation thereof is omitted.

Now, this specification explains the inspection device 200.

Figure 24:
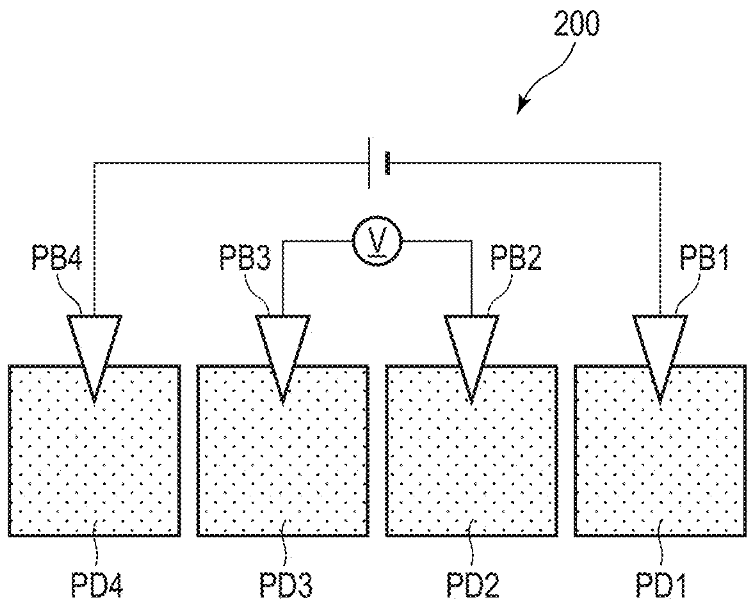
FIG. 24 is a diagram showing an example of an inspection device 200.

FIG. 24 is a diagram showing an example of the inspection device 200.

Probes PB1, PB2, PB3 and PB4 are in contact with the pads PD1, PD2, PD3 and PD4, respectively. The probe PB1 and the probe PB4 are connected to constant-current power supply. The probe PB2 and the probe PB3 are connected to a voltmeter.

As described above, the pad PD1 and the pad PD2 are electrically connected to each other via the line portion LN1, the partition pattern PT1, the partition pattern PT2 and the line portion LN2 and are electrically connected to the partition P40. The pad PD3 and the pad PD4 are electrically connected to each other via the line portion LN3 and are electrically connected to the partition P30.

When the upper electrode UE1 which is in contact with the partition P30 and the partition P40 is formed, the contact resistance between the upper electrode UE1 and the partitions P30 and P40 can be measured by measuring the voltage between the pad PD2 and the pad PD3.

Thus, in the inspection device 200, current is supplied by the constant-current power supply, and a current value is measured, and subsequently, a voltage value is measured by the voltmeter. Based on the measured current value and voltage value, the contact resistance between the upper electrode UE1 and the partitions P30 and P40 is calculated.

Based on the calculated resistance value, the contact resistance between the upper electrode in each of the display elements 201, 202 and 203 and the partition can be managed (indirect measurement). Further, the presence or absence of a defective connection between each upper electrode and the partition can be confirmed based on the calculated resistance value.

An example of the inspection method is explained. Here, the inspection includes the management of the contact resistance and the confirmation of the presence or absence of a defective connection.

First, the display element 201 is formed, and further, the test element group TEG of the inspection portion TPB is also formed. Subsequently, the probes PB of the inspection device 200 are brought into contact with the pads PD of the inspection portion TPB, and the contact resistance is calculated. At this time, the contact resistance is similarly calculated in the inspection portions TPB provided in the mother substrate 100. In this manner, the inspection of the display element 201 can be performed in the entire mother substrate 100.

Subsequently, the display element 202 is formed, and further, the test element group TEG of the inspection portion TPG is also formed. Subsequently, the probes PB of the inspection device 200 are brought into contact with the pads PD of the inspection portion TPG, and the contact resistance is calculated. At this time, the contact resistance is similarly calculated in the inspection portions TPG. In this manner, the inspection of the display element 202 can be performed in the entire mother substrate 100.

Subsequently, the display element 203 is formed, and further, the test element group TEG of the inspection portion TPR is also formed. Subsequently, the probes PB of the inspection device 200 are brought into contact with the pads PD of the inspection portion TPR, and the contact resistance is calculated. At this time, the contact resistance is similarly calculated in the inspection portions TPR. In this manner, the inspection of the display element 203 can be performed in the entire mother substrate 100.

Subsequently, the test element groups TEG of the inspection portions TPB, TPG and TPR are covered with the resin layer 13, etc.

In this manner, the inspection of the display elements 201, 202 and 203 can be performed in the inspection portions TP of the mother substrate 100 before the mother substrate 100 is divided. Thus, the reduction in reliability is prevented. This configuration also prevents the outflow of products whose quality does not satisfy the standard to the subsequent process. Thus, the reduction in yield is prevented. Moreover, as the inspection portions TP provided in the mother substrate 100 are formed based on the same specification, the automated and in-line inspection by the inspection device 200 is made possible.

In the above configuration example, for example, the pad PD1 corresponds to a first pad. The pad PD2 corresponds to a second pad. The pad PD3 corresponds to a third pad. The pad PD4 corresponds to a fourth pad.

The line portion LN1 corresponds to a first line portion. The line portion LN2 corresponds to a second line portion. The line portion LN3 corresponds to a third line portion.

The partition P30 corresponds to a first partition. The partition P40 corresponds to a second partition.

The terminal TM1 corresponds to a first terminal. The terminal TM2 corresponds to a second terminal. The terminal TM3 corresponds to a third terminal.

Now, this specification explains another configuration example of an inspection portion TP.

Figure 25:
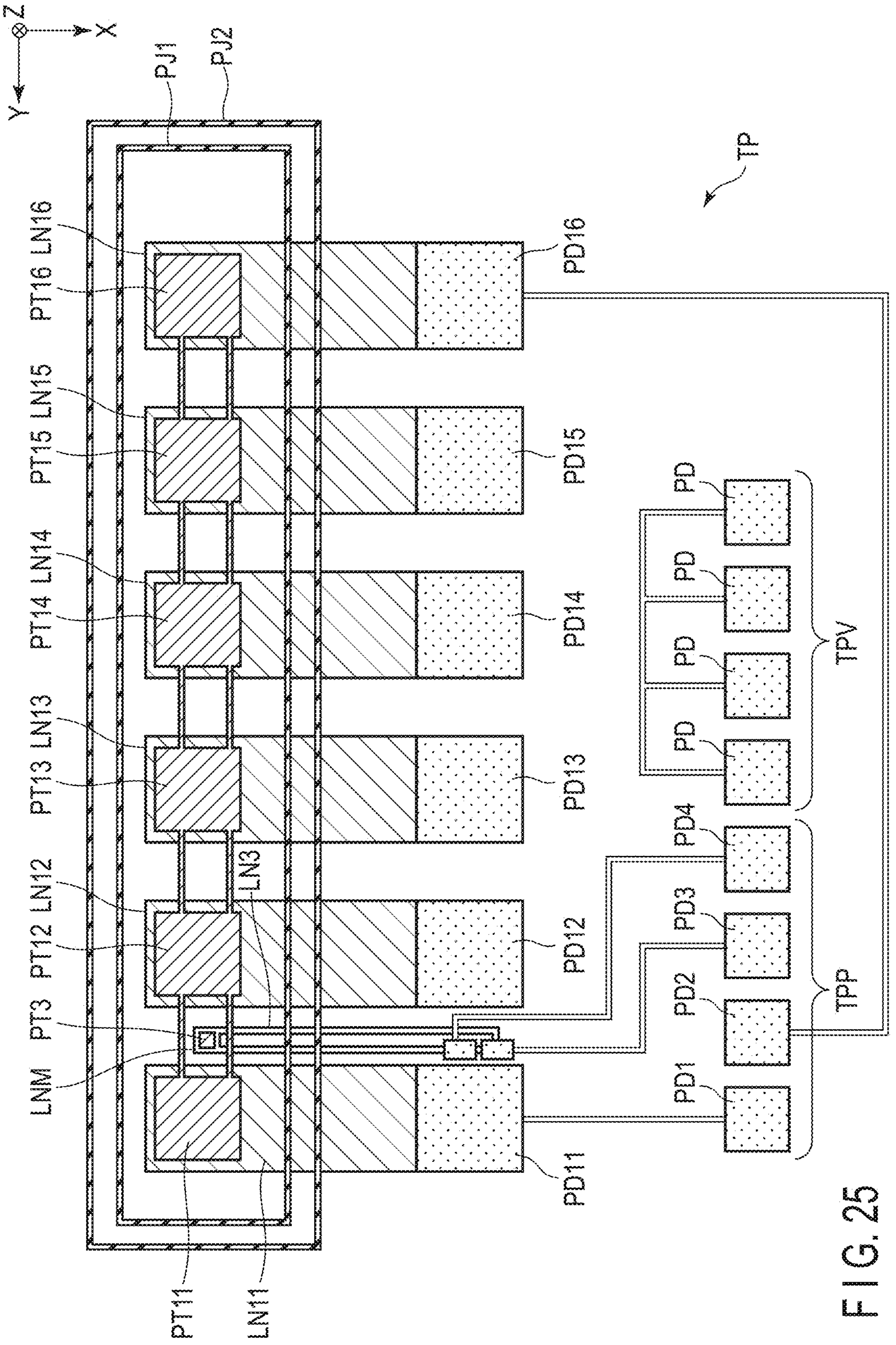
FIG. 25 is a plan view in which an inspection portion TP is enlarged.

FIG. 25 is a plan view in which an inspection portion TP is enlarged.

Pads PD11, PD12, PD13, PD14, PD15 and PD16 are arranged at regular pitches in the second direction Y.

A line portion LN11 is electrically connected to the pad PD11. A line portion LN12 is electrically connected to the pad PD12. A line portion LN13 is electrically connected to the pad PD13. A line portion LN14 is electrically connected to the pad PD14. A line portion LN15 is electrically connected to the pad PD15. A line portion LN16 is electrically connected to the pad PD16.

A partition pattern PT11 overlaps the line portion LN11. A partition pattern PT12 overlaps the line portion LN12. A partition pattern PT13 overlaps the line portion LN13. A partition pattern PT14 overlaps the line portion LN14. A partition pattern PT15 overlaps the line portion LN15. A partition pattern PT16 overlaps the line portion LN16.

The partition patterns PT11, PT12, PT13, PT14, PT15 and PT16 are connected to each other and are surrounded by the projecting bodies PJ1 and PJ2. Although not described in detail, each of the partition patterns PT11, PT12, PT13, PT14, PT15 and PT16 is formed into the same grating shape as the partition 6 of the display area DA shown in FIG. 2.

For example, the pad PD12 is connected to an inspection device for managing the quality of the display element 201 after the formation of the display element 201. Similarly, the pad PD13 is connected to an inspection device for managing the quality of the display element 202 after the formation of the display element 202. Similarly, the pad PD14 is connected to an inspection device for managing the quality of the display element 203 after the formation of the display element 203.

The inspection portion TPV is used to confirm the operation of the inspection device 200. The four pads PD of the inspection portion TPV are arranged at regular pitches in the second direction Y and are electrically connected to each other.

An inspection portion TPP is used to manage the contact resistance between the upper electrode of each of the display elements 201, 202 and 203 and the partition 6.

The pads PD1, PD2, PD3 and PD4 of the inspection portion TPP are arranged at regular pitches in the second direction Y. The pads PD1, PD2, PD3 and PD4 and the four pads PD of the inspection portion TPV are arranged in a line.

The pad PD1 is electrically connected to the pad PD11.

The pad PD2 is electrically connected to the pad PD16.

The pad PD3 and the pad PD4 are electrically connected to the line portion LN3. The line portion LN3 comprises the middle portion LNM located between the line portion LN11 and the line portion LN12.

The partition pattern PT3 overlaps the middle portion LNM of the line portion LN3. The partition pattern PT3 is formed into an island-like shape and is surrounded by another partition pattern connecting the partition pattern PT11 and the partition pattern PT12. An area including the partition pattern PT3 comprises a configuration similar to that explained with reference to FIG. 16 to FIG. 21. A similar inspection can be performed using the inspection device 200 described above.

In this configuration example, for example, the pad PD1 corresponds to the first pad. The pad PD2 corresponds to the second pad. The pad PD3 corresponds to the third pad. The pad PD4 corresponds to the fourth pad.

The line portion LN11 corresponds to the first line portion. The line portion LN12 corresponds to the second line portion. The line portion LN3 corresponds to the third line portion.

Figure 26:
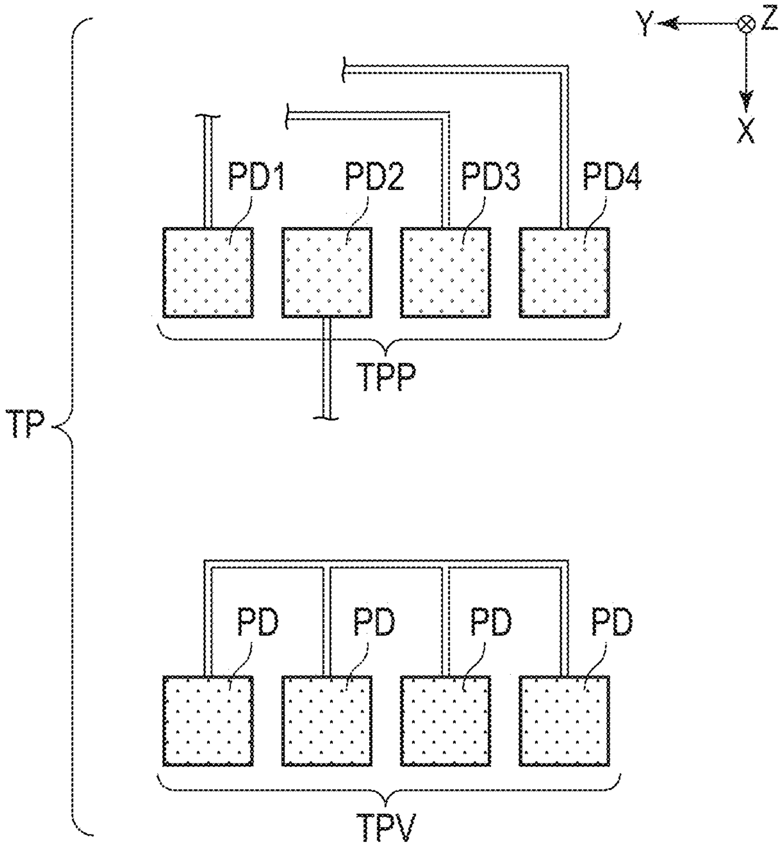
FIG. 26 is a plan view showing a modified example of an inspection portion TP.

FIG. 26 is a plan view showing a modified example of an inspection portion TP.

The modified example shown in FIG. 26 is different from the example shown in FIG. 25 in respect that the inspection portion TPP and the inspection portion TPV are arranged in the first direction X. The four pads PD of the inspection portion TPV are arranged at regular pitches in the second direction Y. The pads PD1, PD2, PD3 and PD4 of the inspection portion TPP are arranged at regular pitches in the second direction Y.

Even if the layout of this modified example is applied, a similar inspection can be performed using the inspection device 200 described above.

As explained above, the present embodiment can provide a mother substrate for a display device such that the reduction in reliability can be prevented.

All of the mother substrates that can be implemented by a person of ordinary skill in the art through arbitrary design changes to the mother substrate described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A mother substrate for a display device, comprising:
a substrate;
a plurality of panel portions provided above the substrate; and
an inspection portion provided on an external side relative to the panel portions above the substrate, wherein
the inspection portion comprises:
first, second, third and fourth pads arranged in order in a direction;
a first line portion electrically connected to the first pad;
a second line portion electrically connected to the second pad;
a third line portion electrically connected to the third pad and the fourth pad and comprising a middle portion between the first line portion and the second line portion;
a first partition electrically connected to the middle portion;
a second partition surrounding the first partition and electrically connected to the first line portion and the second line portion;
an organic layer provided between the first partition and the second partition; and
an upper electrode which covers the organic layer,
each of the first partition and the second partition comprises a lower portion formed of a conductive material and an upper portion provided on the lower portion and protruding from a side surface of the lower portion, and
the upper electrode is in contact with the lower portion of the first partition and the lower portion of the second partition.

2. The mother substrate of claim 1, further comprising a projecting body formed like a loop, wherein
the first line portion, the second line portion, the third line portion, the first partition and the second partition are surrounded by the projecting body, and
the first pad, the second pad, the third pad and the fourth pad are located outside the projecting body.

3. The mother substrate of claim 1, wherein
the inspection portion further comprises:
a first terminal electrically connected to the first line portion;
a second terminal electrically connected to the second line portion; and
a third terminal electrically connected to the middle portion,
the lower portion of the first partition is in contact with the third terminal, and
the second partition is electrically connected to the first terminal and the second terminal.

4. The mother substrate of claim 3, wherein
the first pad, the second pad, the third pad, the fourth pad, the first terminal, the second terminal and the third terminal are formed of a same material.

5. The mother substrate of claim 1, wherein
the lower portion of each of the first partition and the second partition comprises a bottom layer and a stem portion provided between the bottom layer and the upper portion,
each of the bottom layer and the upper portion protrudes from a side surface of the stem portion, and
the upper electrode is in contact with the bottom layer of the first partition and the bottom layer of the second partition.

6. The mother substrate of claim 1, further comprising:
an organic insulating layer provided over the panel portions and the inspection portion; and
an inorganic insulating layer provided on the organic insulating layer.

7. The mother substrate of claim 6, wherein
each of the first pad, the second pad, the third pad and the fourth pad is provided on the organic insulating layer and is exposed from the inorganic insulating layer.

8. The mother substrate of claim 6, wherein
the first partition and the second partition are provided on the inorganic insulating layer.

9. The mother substrate of claim 8, wherein
the organic layer provided between the first partition and the second partition is in contact with the inorganic insulating layer.

10. The mother substrate of claim 9, wherein
each of the panel portions comprises:
a lower electrode provided on the organic insulating layer and comprising a peripheral portion covered with the inorganic insulating layer; and
a partition which surrounds the lower electrode,
the organic layer is provided on the lower electrode in each of the panel portions, and the upper electrode is provided on the organic layer in each of the panel portions and is in contact with the partition.

11. The mother substrate of claim 10, further comprising:

a cap layer provided on the upper electrode in each of the panel portions and the inspection portion; and a sealing layer provided on the cap layer and formed of an inorganic insulating material.

12. A mother substrate for a display device, comprising:

a substrate;

a plurality of panel portions provided above the substrate; and an inspection portion provided on an external side relative to the panel portions above the substrate, wherein the inspection portion comprises:

first, second, third and fourth pads arranged in order in a direction;

a first line portion electrically connected to the first pad;

a second line portion electrically connected to the second pad;

a third line portion electrically connected to the third pad and the fourth pad;

a first partition electrically connected to the third line portion;

a second partition surrounding the first partition and electrically connected to the first line portion and the second line portion;

an organic layer provided between the first partition and the second partition; and an upper electrode which covers the organic layer, each of the first partition and the second partition comprises a lower portion formed of a conductive material and an upper portion provided on the lower portion and protruding from a side surface of the lower portion, and the upper electrode is in contact with the lower portion of the first partition and the lower portion of the second partition.

13. The mother substrate of claim 12, further comprising a projecting body formed like a loop, wherein the first line portion, the second line portion and the third line portion intersect with the projecting body as seen in plan view, the first partition and the second partition are surrounded by the projecting body as seen in plan view, and the first pad, the second pad, the third pad and the fourth pad are located outside the projecting body.

14. The mother substrate of claim 12, wherein the inspection portion further comprises:

a first terminal electrically connected to the first line portion;

a second terminal electrically connected to the second line portion; and a third terminal electrically connected to the third line portion, the lower portion of the first partition is in contact with the third terminal, and the second partition is electrically connected to the first terminal and the second terminal.

15. The mother substrate of claim 14, wherein the first pad, the second pad, the third pad, the fourth pad, the first terminal, the second terminal and the third terminal are formed of a same material.

16. The mother substrate of claim 12, wherein the lower portion of each of the first partition and the second partition comprises a bottom layer and a stem portion provided between the bottom layer and the upper portion, each of the bottom layer and the upper portion protrudes from a side surface of the stem portion, and the upper electrode is in contact with the bottom layer of the first partition and the bottom layer of the second partition.

17. The mother substrate of claim 12, further comprising:

an organic insulating layer provided over the panel portions and the inspection portion; and an inorganic insulating layer provided on the organic insulating layer.

18. The mother substrate of claim 17, wherein each of the first pad, the second pad, the third pad and the fourth pad is provided on the organic insulating layer and is exposed from the inorganic insulating layer.

19. The mother substrate of claim 17, wherein the first partition and the second partition are provided on the inorganic insulating layer.

20. The mother substrate of claim 19, wherein the organic layer provided between the first partition and the second partition is in contact with the inorganic insulating layer.

* * * * *